(12) United States Patent
Jung et al.

(10) Patent No.: US 11,699,363 B2
(45) Date of Patent: Jul. 11, 2023

(54) STRETCHABLE DISPLAY DEVICE

(71) Applicant: LG Display Co., Ltd., Seoul (KR)

(72) Inventors: Hyunju Jung, Seoul (KR); Eunah Kim, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 203 days.

(21) Appl. No.: 16/913,457

(22) Filed: Jun. 26, 2020

(65) Prior Publication Data

US 2020/0410909 A1  Dec. 31, 2020

(30) Foreign Application Priority Data

Jun. 28, 2019  (KR) .................. 10-2019-0078134
Apr. 28, 2020  (KR) .................. 10-2020-0051688

(51) Int. Cl.
| | | |
|---|---|---|
| *H01L 51/56* | (2006.01) | |
| *G09F 9/30* | (2006.01) | |
| *H10K 50/844* | (2023.01) | |
| *H10K 59/121* | (2023.01) | |
| *H10K 59/131* | (2023.01) | |
| *H10K 71/00* | (2023.01) | |

(Continued)

(52) U.S. Cl.
CPC ........... *G09F 9/301* (2013.01); *H10K 50/844* (2023.02); *H10K 59/121* (2023.02); *H10K 59/131* (2023.02); *H10K 71/00* (2023.02); *H10K 59/1201* (2023.02); *H10K 2102/101* (2023.02)

(58) Field of Classification Search
CPC ... G09F 9/301; H01L 27/326; H01L 27/3276; H01L 51/5253; H01L 51/56; H01L 2227/323; H01L 2251/305; H01L 51/0096; Y02E 10/549; Y02P 70/50
See application file for complete search history.

(56) References Cited

U.S. PATENT DOCUMENTS

| | | | |
|---|---|---|---|
| 2018/0046221 A1* | 2/2018 | Choi ................. | G02B 26/0825 |
| 2019/0019816 A1* | 1/2019 | Kang .................... | H01L 33/08 |

FOREIGN PATENT DOCUMENTS

KR  10-2018-0047536 A  5/2018

\* cited by examiner

*Primary Examiner* — Thanh T Nguyen
(74) *Attorney, Agent, or Firm* — Seed IP Law Group

(57) ABSTRACT

In the stretchable display device of the present disclosure, peeling and delamination of connection lines between adjacent circuits mounted on individual fixed substrates that might occur during stretching is reduced. According to one embodiment of the stretchable display device, the steepness of a slope in step in an insulating layer in contact with connection lines is reduced, which prevents delamination. A plurality of individual substrates are disposed on the lower substrate and located in the active area on the lower substrate. The modulus of elasticity of the individual substrates is significantly higher than the modulus of elasticity of the lower substrate. There is a first inorganic layer positioned on each of the plurality of individual substrates, the first inorganic layer having a sidewall surface extending upward from the first substrate. A organic layer is deposited overlying the first inorganic layer, including overlying the sidewall surface of the first inorganic layer. An electrical connection line is on the organic layer and not in contact with any part of the inorganic layer, providing the additional adhesion and thus preventing delamination of the electrical connection lines from the substrate.

17 Claims, 26 Drawing Sheets

(51) Int. Cl.
*H10K 59/12* (2023.01)
*H10K 102/10* (2023.01)

STRETCHABLE DISPLAY DEVICE

CROSS-REFERENCE TO RELATED APPLICATIONS

This application claims the priority of Korean Patent Application No. 10-2019-0078134 filed on Jun. 28, 2019 and the priority of Korean Patent Application No. 10-2020-0051688 filed on Apr. 28, 2020 in the Korean Intellectual Property Office, the disclosure of which is incorporated herein by reference.

BACKGROUND

Technical Field

The present disclosure relates to a stretchable display device, and more particularly, to a stretchable display device which is improved in reliability by suppressing line opening in a connection line.

Description of the Related Art

Display devices used for a computer monitor, a TV, a mobile phone, etc., include an organic light-emitting display (OLED) that emits light by itself, a liquid-crystal display (LCD) that uses a separate light source, etc.

As the display devices have been increasingly used in diverse fields such as a computer monitor, a TV, and a personal mobile device, display devices having a large display area and a reduced volume and weight have been studied.

Recently, a stretchable display device in which a display part, lines, etc., are formed on a flexible substrate which can be stretched in a specific direction and deformed into various shapes has attracted attention as a next-generation display device.

BRIEF SUMMARY

An object to be achieved by the present disclosure is to provide a stretchable display device having higher reliability over long term use. In the stretchable display device of the present disclosure, peeling and delamination of connection lines between adjacent circuits mounted on individual fixed substrates that might occur during stretching of a lower, flexible substrate is reduced.

According to one embodiment of the stretchable display device, the steepness of a slope in step in an insulating layer in contact with connection lines is reduced, and, thus, peeling of the connection lines from the insulation layer can be reduced when the display device undergoes repeated stretching.

According to one embodiment, an undercut portion which may be formed in a substrate during manufacturing is filled with an overcoating layer, and, thus connection lines are protected from entering the undercut and instead transition from a horizontal surface at a first height to a horizontal surface at a second, higher height on a smooth, gradual slope, resulting in a breakage of connection lines being suppressed.

According to one embodiment damage to a thin film transistor, a capacitor, and connection lines disposed on a fixed substrate that is positioned on a flexible lower substrate can be reduced.

In one embodiment, contact points of connection lines are disposed on a protruding portion of a first substrate, and, thus, the area of the first substrate can be secured.

According to one embodiment of the present disclosure, a lower substrate has an active area and a non-active area adjacent to the active area, the lower substrate having a first modulus of elasticity. A plurality of individual substrates are disposed on the lower substrate and located in the active area on the lower substrate. In one embodiment, the modulus of elasticity of the individual substrates is significantly higher than the modulus of elasticity of the lower substrate. The individual substrates are spaced from each other. There is a first inorganic layer positioned on each of the plurality of individual substrates, the first inorganic layer having a sidewall surface extending upward from the first substrate. An organic layer is deposited overlying the first inorganic layer, including overlying the sidewall surface of the first inorganic layer. In some embodiments, the organic layer is in direct contact with the sidewall and top surfaces of the inorganic layer. In other embodiments, it is only in direct contact with the sidewall surface of the inorganic layer and not with the top surface. In other embodiments, it overlies the first inorganic layer and does not directly contact it and there are one or more layers between the inorganic layer and the organic layer.

The organic layer having a sidewall surface extending upward from the first substrate. There are a plurality of respective pixels disposed on the respective plurality of individual substrates on the organic layer. Each pixel has electrical components comprising the pixel, An electrically conductive connection line is disposed between components of the respective pixels on two adjacent individual substrates. In some embodiments, the connection line is directly on the organic layer.

In some embodiments, the sidewall surface of the first inorganic layer extends upward from the first substrate at a first angle relative to the upper surface of the first substrate and the sidewall surface of the organic layer extends upward from the first substrate at a second angle relative the upper surface of the first substrate. In some embodiments, first angle is within the range of 85° to 90° and the second angle is within the range of 65° to 85°.

In a practical application, the lower substrate has a first modulus of elasticity and each individual substrate has a second modulus of elasticity that is higher than the first modulus of elasticity.

In further practical applications, there is a second inorganic layer overlying the first inorganic layer, the second inorganic layer having a sidewall surface, the organic layer overlying the second inorganic layer, including overlying the sidewall of the second inorganic layer.

In some embodiments, a portion of the organic layer extends underneath a region of the first inorganic layer.

A method of manufacturing the display device as disclosed herein my include the steps of forming a plurality of individual substrates on a lower substrate; forming a connection support layer extending between adjacent individual substrates; forming a transistor on each of the plurality of individual substrates; depositing a first inorganic layer on each of the individual substrates, the inorganic having a sidewall surface extending upward from the individual substrate; depositing an organic layer overlying the individual substrates and the inorganic layer, including the sidewall of the inorganic layer and the lower substrate; patterning and etching the organic layer to remove it from lower substrate; depositing an electrically conductive connection layer overlying the connection support layer; and patterning and etching the electrically conductive connection layer to form a connection line extending between adjacent individual substrates.

In some embodiments, the step of depositing of the organic layer is carried out after the step of forming the connection support layer. In other embodiments, the steps of forming a plurality of individual substrates on a lower substrate and forming a connection support layer extending between adjacent individual substrates are carried out concurrently.

In a practical application, the connection support is created by etching the connection support layer and during its etching, an undercut is create below the top surface of the inorganic layer and the undercut is filled with the organic layer during the depositing of the organic layer. After the organic layer is deposited, a light emitting diode is placed on the organic layer on each of the first substrates.

Objects and benefits of the present disclosure are not limited to the above-mentioned benefits and the embodiments are not so limited to those stated herein and other benefits which are not mentioned above, can be clearly understood by those skilled in the art from the following descriptions.

According to the present disclosure, when a stretchable display device is stretched repeatedly, the peeling of connection lines is suppressed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
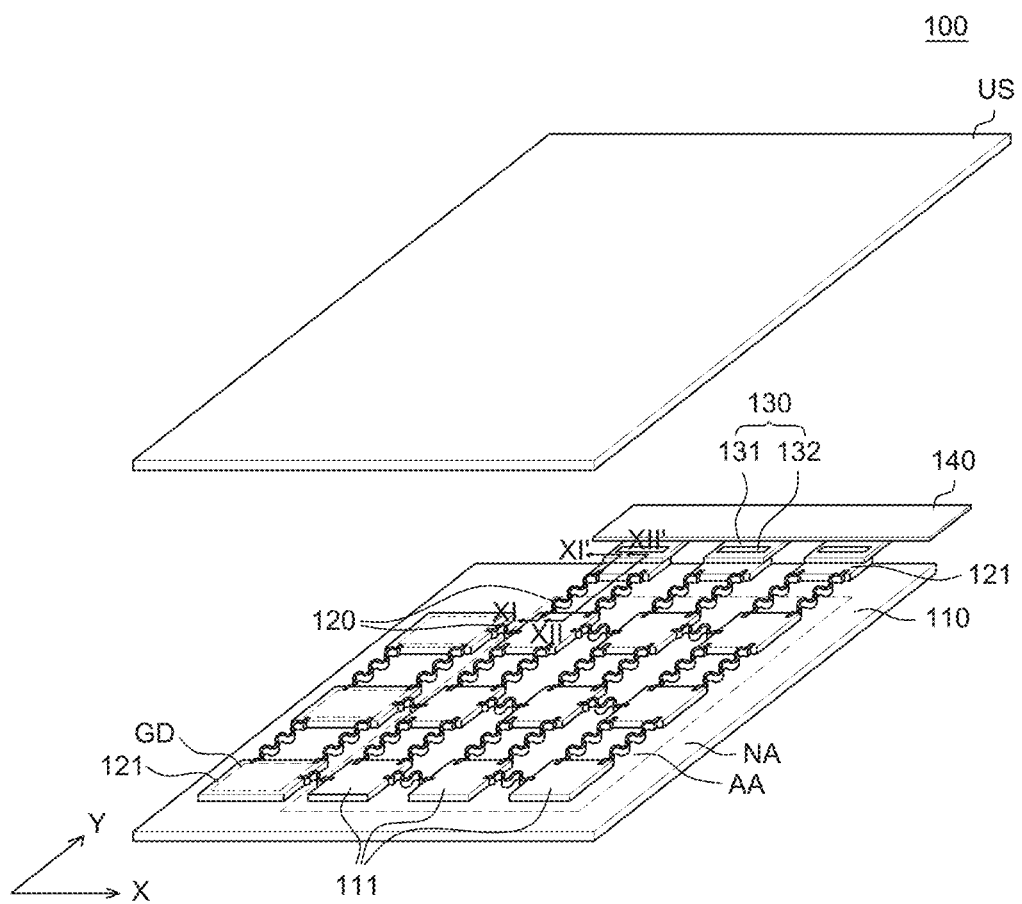
FIG. 1 is an exploded perspective view illustrating a stretchable display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description and ease of understanding, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, example embodiments of the present disclosure will be described in detail with reference to accompanying drawings.

A stretchable display device may refer to a display device which can display images even it is bent or stretched. The stretchable display device may have higher flexibility than typical display devices. Thus, the stretchable display device can be freely deformed by a user's manipulation such as bending or stretching of the stretchable display device. For example, when the user seizes an end of the stretchable display device and pulls the stretchable display device, the stretchable display device can be stretched by force of the user. If the user places the stretchable display device on an uneven wall surface, the stretchable display device can be bent according to the shape of the wall surface. When the force applied by the user is removed, the stretchable display device can return to its original shape.

FIG. 1 is an exploded perspective view illustrating a stretchable display device according to an example embodiment of the present disclosure. Referring to FIG. 1, a stretchable display device 100 includes a lower substrate 110, a plurality of first substrates 111, a plurality of connection supports 120, a plurality of second substrates 121, a COF (Chip on Film) 130, a printed circuit board 140, and an upper substrate US. FIG. 1 also shows a plurality of electrical connections lines 180, which include lines 181 and 182 that are supported by and lie directly on top of the connection supports 120, as described later herein. These lines 181 and 182 electrically connect the first substrates 111 to each other and also the second substrates 121 to each other and first substrates 111, as also described later herein.

The lower substrate 110 serves to protect and support various components disposed in the stretchable display device 100. The lower substrate 110 is a ductile substrate and may be formed of an insulating material which can be bent or stretched. For example, the lower substrate 110 may be formed of silicone rubber such as polydimethylsiloxane (PDMS) and an elastomer such as polyurethane (PU), and polytetrafluoroethylene (PTFE). Thus, the lower substrate 110 may have flexibility. However, the materials of the lower substrate 110 are not limited thereto.

The lower substrate 110 is a ductile substrate and can be reversibly expanded and contracted. Further, the lower substrate 110 may have an elastic modulus ranging from several MPa to several hundreds of MPa and may have a stretch failure of 100% or more. Herein, the stretch failure refers to a stretch rate at the time when an object being stretched is destroyed or cracked. The thickness of the lower substrate 110 may be from 10 μm to 1 mm, but is not limited thereto.

The lower substrate 110 may include an active area AA and a non-active area NA surrounding the active area AA.

The active area AA refers to an area of the stretchable display device 100 in which images are displayed. In the active area AA, a display element and various drive elements for driving the display element are disposed. The active area AA includes a plurality of pixels including a plurality of sub-pixels. The plurality of pixels are disposed in the active area AA and each includes a plurality of display elements called subpixels. Each of the plurality of sub-pixels may be connected to various lines. For example, each of the plurality of sub-pixels may be connected to various lines such as a gate line, a data line, a high-potential power line, a low-potential power line, a reference voltage line, etc.

The non-active area NA refers to an area adjacent to the active area AA. The non-active area NA is formed around the active area AA. In the non-active area NA, images are not displayed, and lines and circuits may be disposed in NA.

For example, a plurality of pads may be disposed in the non-active area NA, and the pads may be connected respectively to the plurality of sub-pixels disposed in the active area AA.

On the lower substrate 110, the plurality of first substrates 111 and the plurality of second substrates 121 are disposed. The plurality of first substrates 111 may be disposed in the active area AA of the lower substrate 110, and the plurality of second substrates 121 may be disposed in the non-active area NA of the lower substrate 110. FIG. 1 illustrates that the plurality of second substrates 121 in the non-active area NA is disposed on the upper side and left side of the active area AA. However, the present disclosure is not limited thereto. The plurality of second substrates 121 may be disposed in any region of the non-active area NA.

The plurality of first substrates 111 and the plurality of second substrates 121 are rigid substrates and independently spaced apart from each other on the lower substrate 110. The plurality of first substrates 111 and the plurality of second substrates 121 may be more rigid than the lower substrate 110. That is, the lower substrate 110 may be more ductile than the plurality of first substrates 111 and the plurality of second substrates 121. Also, the plurality of first substrates 111 and the plurality of second substrates 121 may be more rigid than the lower substrate 110.

The plurality of first substrates 111 and the plurality of second substrates 121 as a plurality of rigid substrates may be formed of a plastic material having flexibility. The plurality of first substrates 111 and the plurality of second substrates 121 may be formed of, for example, polyimide (PI), polyacrylate, polyacetate, etc. In this case, the plurality of first substrates 111 may be formed of the same material as the plurality of second substrates 121, but is not limited thereto. The first substrates 111 may also be formed of a different material from the plurality of second substrates 121.

The plurality of first substrates 111 and the plurality of second substrates 121 may have a higher modulus than the lower substrate 110. Herein, the modulus refers to an elastic modulus that is the ratio of the stress applied to a substrate to a change caused by the stress. If the modulus is relatively high, the rigidity may be relatively high. Therefore, the plurality of first substrates 111 and the plurality of second substrates 121 may be a plurality of rigid substrates having a higher rigidity than the lower substrate 110. The modulus of the plurality of first substrates 111 and the plurality of second substrates 121 may be 1000 times or more than that of the lower substrate 110, but is not limited thereto.

In some example embodiments, the lower substrate 110 may be defined as including a plurality of first lower patterns and a second lower pattern. The plurality of first lower patterns may be disposed in a region of the lower substrate 110 which overlaps the plurality of first substrates 111 and the plurality of second substrates 121. Also, the second lower pattern may be disposed in a region except the region where the plurality of first substrates 111 and the plurality of second substrates 121 are disposed. Otherwise, the second lower pattern may be disposed in the entire region of the stretchable display device 100.

In this case, the plurality of first lower patterns may have a higher modulus than the second lower pattern. For example, the plurality of first lower patterns may be formed of the same material as the plurality of first substrates 111. Also, the second lower pattern may be formed of a material having a lower modulus than the plurality of first substrates 111.

The COF 130 refers to a film formed by placing various components on a ductile base film 131 and is configured to supply signals to the plurality of sub-pixels in the active area AA. The COF 130 may be bonded to the plurality of pads of the plurality of second substrates 121 disposed in the non-active area NA. The COF 130 may supply power voltage, data voltage, gate voltage, etc., through the pads to the respective sub-pixels disposed in the active area AA. The COF 130 may include the base film 131 and a drive IC 132 and may further include various components thereon.

The base film 131 serves to support the drive IC 132 of the COF 130. The base film 131 may be formed of an insulating material. For example, the base film 131 may be formed of an insulating material having flexibility.

The drive IC 132 is configured to process data for displaying an image and a drive signal for processing the data. FIG. 1 illustrates that the drive IC 132 is mounted by a COF method, but is not limited thereto. The drive IC 132 may also be mounted by a Chip On Glass (COG) method or a Tape Carrier Package (TCP) method.

FIG. 1 illustrates that a second substrate 121 is disposed in the non-active area NA on the upper side of the active area AA so as to correspond to first substrates 111 in a row disposed in the active area AA. Also, FIG. 1 illustrates that a COF 130 is disposed on the second substrate 121. However, the present disclosure is not limited thereto. That is, a second substrate 121 and a COF 130 may be disposed so as to correspond to first substrates 111 in a plurality of rows.

In the printed circuit board 140, a control unit such as an IC chip, a circuit, etc., may be disposed. Further, in the printed circuit board 140, a memory, a processor, etc., may also be disposed. The printed circuit board 140 is configured to transfer a signal for driving the display elements from the control unit to the display elements. Although FIG. 1 illustrates that three the printed circuit board 140 are used, the number of printed circuit boards 140 is not limited thereto.

Hereafter, the stretchable display device 100 according to an example embodiment of the present disclosure will be described in more detail with reference to FIG. 2 and FIG. 3.

Figure 2:
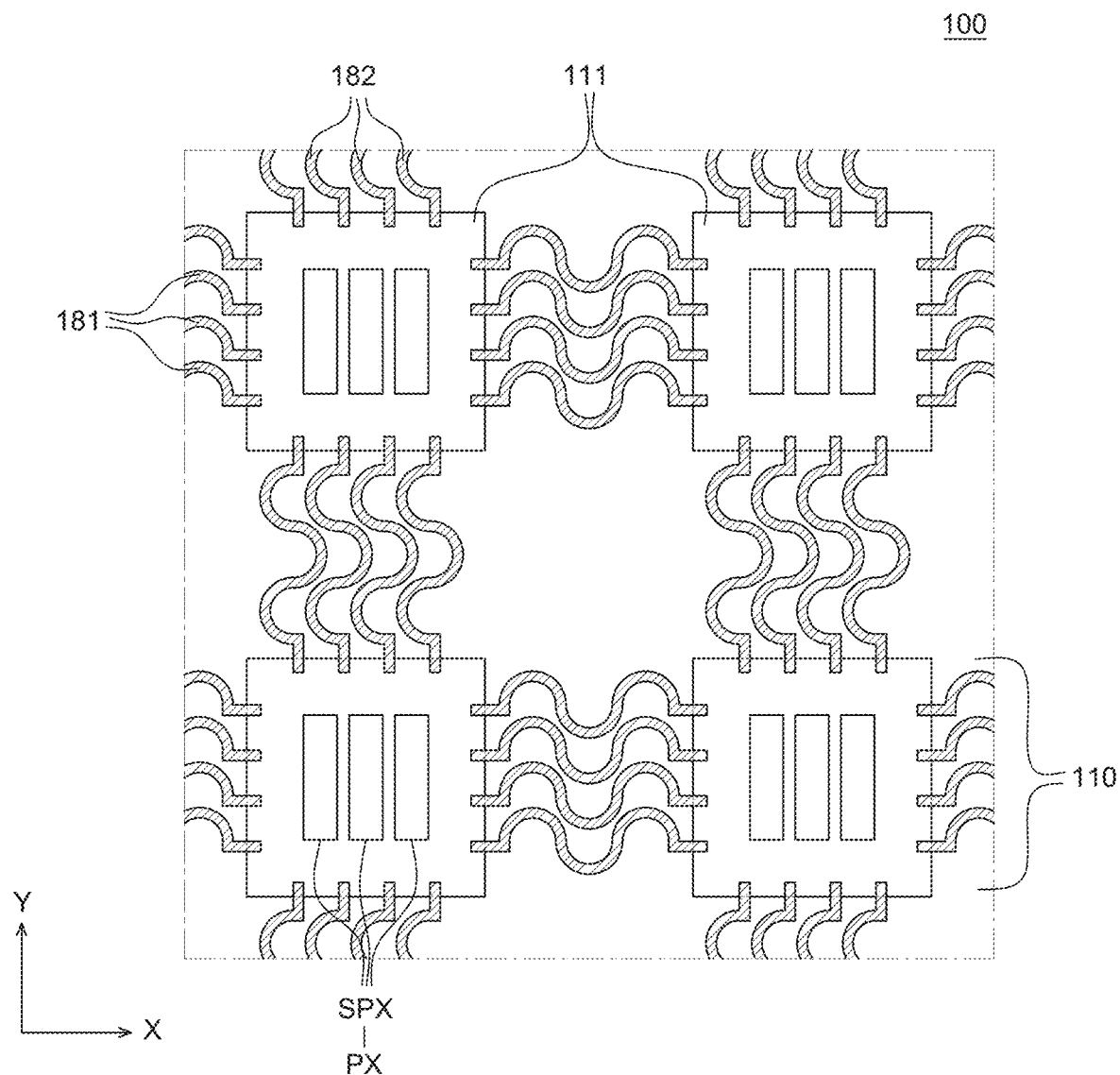
FIG. 2 is an enlarged plan view illustrating a stretchable display device according to an example embodiment of the present disclosure.

FIG. 2 is an enlarged plan view illustrating a stretchable display device according to an example embodiment of the present disclosure. FIG. 3 is a schematic cross-sectional view illustrating a sub-pixel of FIG. 2. FIG. 1 will also be referred to for convenience of explanation.

Referring to FIG. 1 and FIG. 2, the plurality of first substrates 111 is disposed on the lower substrate 110 in the active area AA. The plurality of first substrates 111 is disposed and spaced apart from each other on the lower substrate 110. For example, the plurality of first substrates 111 may be disposed in a matrix form on the lower substrate 110 as shown in FIG. 1 and FIG. 2, but is not limited thereto.

Referring to FIG. 1 and FIG. 2, a plurality of sub-pixels SPX constituting a plurality of pixels PX may be disposed in the plurality of first substrates 111. Further, gate drivers GD may be mounted respectively on second substrates 121 located on the left side of the active area AA among the plurality of second substrates 121. The gate drivers GD may be formed on the second substrates 121 by a Gate In Panel (GIP) method when various components on the first substrates 111 are fabricated. Thus, various circuit components, such as various transistors, capacitors, and lines, constituting the gate drivers GD may be disposed on the plurality of second substrates 121. However, the present disclosure is not limited thereto. The gate drivers GD may be mounted by a COF method. Otherwise, the plurality of second substrates 121 may be disposed in the non-active area NA on the right side of the active area AA. Also, the gate drivers GD may be mounted on the plurality of second substrates 121 located on the right side of the active area AA.

Referring to FIG. 1, the plurality of second substrates 121 may be larger in size than the plurality of first substrates 111. Specifically, each of the plurality of second substrates 121 may be larger than each of the plurality of first substrates 111. As described above, the gate drivers GD are disposed on the plurality of second substrates 121, respectively. For example, a single stage of the gate driver GD may be disposed on each of the plurality of second substrates 121. Therefore, the size of various circuit components constituting a single stage of the gate driver GD is relatively larger than the first substrate 111 in which pixels PX are disposed. Accordingly, each of the plurality of second substrates 121 may have a larger size than each of the plurality of first substrates 111.

Referring to FIG. 1 and FIG. 2, a plurality of connection supports 120 may be disposed between the plurality of first substrates 111 or between the plurality of second substrates 121. Otherwise, the plurality of connection supports 120 may be disposed between the plurality of first substrates 111 and the plurality of second substrates 121. The plurality of connection supports 120 serves to connect the first substrates 111 adjacent to each other, the second substrates 121 adjacent to each other, or the first substrates 111 and the second substrates 121. Thus, the plurality of connection supports 120 can also be referred to as connection substrates. The plurality of connection supports 120 may be formed of the same material as the first substrates 111 or the second substrates 121. They can be and simultaneously formed as one body with the first substrates 111 or the second substrates 121, but they are not limited to being formed in this manner. For example, connection supports 120 can be formed on the lower substrate 110 after the first substrates 111 and second substrates 121 are placed thereon, as explained later herein.

Referring to FIG. 2, a plurality of electrical connections lines 181 and 182 are provided that electrically connect the first substrates 111 to each other and also the second substrates 121 to each other and first substrates 111. As shown in FIG. 1, these lines overlie directly on top of the connection supports 120, therefore, the connection supports 120 cannot be seen in FIG. 2 in those locations where the connection lines 181 and 182 are present.

Referring to FIG. 2, the connection supports 120 are shown a number of places prior to the connection lines 181 and 182 being formed over them. As can be seen, the plurality of connection supports 120 is wavy, exactly matching the shape of the respective connection lines they support. For example, as shown in FIG. 2, the plurality of connection supports 120 may have a sine wave shape. However, the shape of the plurality of connection supports 120 is not limited thereto. For example, the plurality of connection supports 120 may be extended in a zigzag shape, or the plurality of diamond-shaped connection supports 120 may be extended and connected to each other at their vertices. The number and shape of the plurality of connection supports 120 shown in FIG. 2 is just an example. The number and shape of the plurality of connection supports 120 may vary depending on the design. In a preferred embodiment, the shape of the connection supports will match the shape of the connection lines 181 and 182 that they support.

Figure 3:
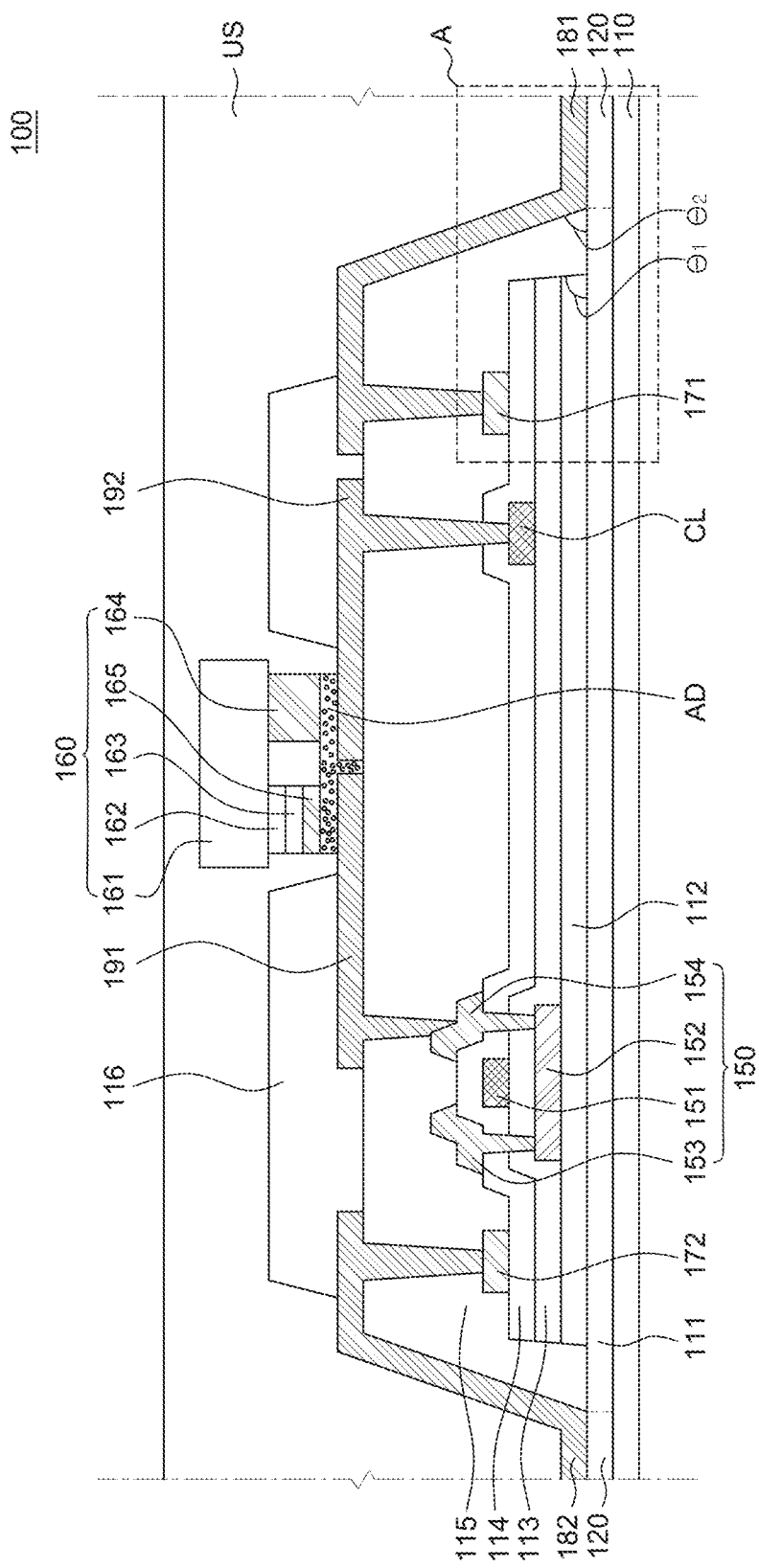
FIG. 3 is a schematic cross-sectional view illustrating a sub-pixel of FIG. 2.

Referring to FIG. 3, a plurality of inorganic insulating layers is formed on the plurality of first substrates 111. For example, the plurality of inorganic insulating layers may include a buffer layer 112, a gate insulating layer 113, and an interlayer insulating layer 114, but is not limited thereto. Various inorganic insulating layers may be further disposed on the plurality of first substrates 111. In some embodiments one or more of the buffer layer 112, the gate insulating layer 113, and the interlayer insulating layer 114 may be omitted.

Referring to FIG. 3, the buffer layer 112 is disposed on the plurality of first substrates 111. The buffer layer 112 is formed on the plurality of first substrates 111 to protect various components of the stretchable display device 100 against permeation of moisture ($H_2O$), oxygen ($O_2$), and the like from the outside of the lower substrate 110 and the plurality of first substrates 111. The buffer layer 112 may be formed of an insulating material. For example, the buffer layer 112 may be formed as one or more inorganic layers of silicon nitride (SiNx), silicon oxide (SiOx), silicon oxynitride (SiON), etc. However, the buffer layer 112 may be omitted depending on the structure or characteristics of the stretchable display device 100.

In one embodiment, the substrates 111 and 121, and all the layers thereon, are each formed in a separate process from the formation of lower substrate 110. After the substrates 111 and 112 are formed, they are placed at selected locations on lower substrate 110, as shown in FIG. 1.

As described above, the buffer layer 112 may be formed of an inorganic material. Thus, the buffer layer 112 may be easily damaged, such as cracked, while the stretchable display device 100 is being stretched. Therefore, the buffer layer 112 is preferably not formed between the plurality of first substrates 111 and the plurality of second substrates 121. Rather, the buffer layer 112 may be formed and patterned only on the plurality of first substrates 111 and the plurality of second substrates 121. In the stretchable display device 100 according to an example embodiment of the present disclosure, the buffer layer 112 is formed only in a region respective first substrates 111 and second substrates 121 which are rigid substrates. Thus, it is possible to suppress damage to the buffer layer 112 even when the stretchable display device 100 is deformed, such as bent or stretched since this buffer layer 112 is fully on the rigid substrates 111 and 112.

Referring to FIG. 3, a transistor 150 including a gate electrode 151, an active layer 152, a source electrode 153, and a drain electrode 154 is formed on the buffer layer 112.

Referring to FIG. 3, first, the active layer 152 is disposed on the buffer layer 112. For example, the active layer 152 may be formed of an oxide semiconductor or may be formed of amorphous silicon (a-Si), polycrystalline silicon (poly-Si), an organic semiconductor, or the like.

The gate insulating layer 113 is disposed on the active layer 152. The gate insulating layer 113 serves as a layer for electrically insulating the gate electrode 151 and the active layer 152 and may be formed of an insulating material. For example, the gate insulating layer 113 may be formed as one or more inorganic layers of silicon nitride (SiNx) or silicon oxide (SiOx), but is not limited thereto.

The gate electrode 151 is disposed on the buffer layer 112. The gate electrode 151 is disposed to overlap the active layer 152. The gate electrode 151 may be formed of any one of various metal materials, for example, molybdenum (Mo), aluminum (Al), chromium (Cr), gold (Au), titanium (Ti), nickel (Ni), neodymium (Nd), and copper (Cu). Otherwise, the gate electrode 151 may be formed of an alloy of two or more of them or may be formed as a multi-layer thereof, but is not limited thereto.

The interlayer insulating layer 114 is disposed on the gate electrode 151. The interlayer insulating layer 114 serves to insulate the gate electrode 151 from the source electrode 153 and the drain electrode 154 and may be formed of an inorganic material like the buffer layer 112. For example, the interlayer insulating layer 114 may be formed as one or more inorganic layers of silicon nitride (SiNx) or silicon oxide (SiOx), but is not limited thereto.

The source electrode 153 and the drain electrode 154 in contact with the active layer 152 are disposed on the interlayer insulating layer 114. The source electrode 153 and the drain electrode 154 are disposed and spaced apart from each other on the same layer. The source electrode 153 and the drain electrode 154 in contact with the active layer 152 may be electrically connected to the active layer 152. The source electrode 153 and the drain electrode 154 may be formed of any one of various metal materials, for example, molybdenum (Mo), aluminum (Al), chromium (Cr), gold (Au), titanium (Ti), nickel (Ni), neodymium (Nd), and copper (Cu). Otherwise, the source electrode 153 and the drain electrode 154 may be formed of an alloy of two or more of them or may be formed as a multi-layer thereof, but is not limited thereto.

Further, the gate insulating layer 113 and the interlayer insulating layer 114 may be patterned and formed only in a region overlapping the plurality of first substrates 111. The gate insulating layer 113 and the interlayer insulating layer 114 may also be formed of an inorganic material like the buffer layer 112. Thus, the gate insulating layer 113 and the interlayer insulating layer 114 may be easily damaged, such as cracked, while the stretchable display device 100 is stretched. Therefore, the gate insulating layer 113 and the interlayer insulating layer 114 may not be formed between the plurality of first substrates 111. The gate insulating layer 113 and the interlayer insulating layer 114 may be patterned into the plurality of first substrates 111 and formed only on the plurality of first substrates 111.

For convenience of explanation, FIG. 3 illustrates only a driving transistor among various transistors which can be included in the stretchable display device 100. However, a switching transistor, a capacitor, etc., can also be included in the display device and positioned on the same first substrate 111 with the pixel. Further, in the present disclosure, the transistor 150 has been described as having a coplanar structure, but various transistors having a staggered structure, or the like may also be used.

Referring to FIG. 3, a plurality of pads 170 is disposed on the interlayer insulating layer 114. Specifically, a gate pad 171 is disposed on the interlayer insulating layer 114 among the plurality of pads 170. The gate pad 171 serves to transfer gate signals to the plurality of sub-pixels SPX. A gate signal may be transferred from the gate pad 171 to the gate electrode 151 through a gate line formed on the first substrate 111. The gate pad 171 may be formed of the same material as the source electrode 153 and the drain electrode 154, but is not limited thereto.

Referring to FIG. 3, a data pad 172 is disposed on the interlayer insulating layer 114 among the plurality of pads 170. The data pad 172 serves to transfer data signals to the plurality of sub-pixels SPX. A data signal may be transferred from the data pad 172 to the source electrode 153 or the drain electrode 154 through a data line formed on the first substrate 111. The data pad 172 may be formed of the same material as the source electrode 153 and the drain electrode 154, but is not limited thereto.

Referring to FIG. 3, an overcoating layer 115 is formed on the transistor 150 and the interlayer insulating layer 114. The overcoating layer 115 serves as a planarizing layer over the transistor 150, thus providing a flat upper surface over the transistor 150. The overcoating layer 115 may be formed as one or more layers and formed of an organic material. Thus, the overcoating layer 115 may also be referred to as an organic insulating layer or an organic planarizing layer. For example, the overcoating layer 115 may be formed of an acryl-based organic material, but is not limited thereto. While in a preferred embodiment, overcoating layer 115 is a single layer of organic material deposited as in single step as one complete layer, in some embodiments, layer 115 can also be an comprised of one or more layers that are deposited sequentially. For example overcoating layer 115 can be deposited as two or more sequential layers, both of which are organic or can be deposited having some layers that are inorganic with an organic layer being deposited first in contact with the buffer layer 112 and then further layers, some organic and some inorganic overlaying the first deposited organic layer and all the layers together forming the overcoating layer 115.

Referring to FIG. 3, the overcoating layer 115 is disposed on the plurality of first substrates 111 to cover upper surfaces and side surfaces of the buffer layer 112, the gate insulating layer 113, and the interlayer insulating layer 114. Also, together with the plurality of first substrates 111, the overcoating layer 115 surrounds the buffer layer 112, the gate insulating layer 113, and the interlayer insulating layer 114. Specifically, the overcoating layer 115 may be disposed to cover an upper surface and a side surface of the interlayer insulating layer 114, a side surface of the gate insulating layer 113, a side surface of the buffer layer 112, and a part of upper surfaces of the plurality of first substrates 111. Thus, the overcoating layer 115 can compensate for a steep, vertical step on the side surfaces of the buffer layer 112, the gate insulating layer 113, and the interlayer insulating layer 114. Also, the overcoating layer 115 can enhance the adhesion strength between the overcoating layer 115 and connection lines 180 disposed on a side surface of the overcoating layer 115. Namely, the overcoating layer can provide a stronger adhesion to connection lines 180 than would be provided by the side surfaces of layers 112, 113 and 114.

Referring to FIG. 3, an incline angle θ2 of the side surface of the overcoating layer 115 may be lower than an incline angle θ1 of the side surfaces of the buffer layer 112, the gate insulating layer 113, and the interlayer insulating layer 114. In some embodiments, the angle θ1 can about 90°. On the other hand, the angle θ2 can be in the range of 80° to 70°, or in some cases can be 60°. For example, the side surface of the overcoating layer 115 may have a lower incline angle than the side surface of the interlayer insulating layer 114, the side surface of the gate insulating layer 113, and the side surface of the buffer layer 112. Thus, the connection lines 180 in contact with the side surface of the overcoating layer 115 are disposed with a low incline angle. Therefore, when the stretchable display device 100 is stretched, stress generated on the connection lines 180 can be reduced. Also, it is possible to suppress cracks in the connection lines 180 or peeling of the connection lines 180 from the side surface of the layers on the substrate 111 because the overcoating layer 115 is present. This suppression of peeling is provided by at least two factors, first, the overcoating layer has a stronger adhesion to the connection lines 180 than the layers 112, 113 and 114 and second, because the angle θ2 is less than the angle θ1. The layers 112, 113 and 114 constitute first, second and third inorganic layers on the substrate 111 and the overcoating layer 115 can be an organic layer that is over and in contact with each of these layers.

In some embodiments, a passivation layer may be formed between the transistor 150 and the overcoating layer 115. That is, the passivation layer covering the transistor 150 may be formed to protect the transistor 150 against permeation of moisture, oxygen, and the like. The passivation layer may be formed of an inorganic material and formed as one or more layers, but is not limited thereto. The passivation layer may be considered a sublayer of layer 115 in some embodiments.

Referring to FIG. 3, a common line CL is disposed on the gate insulating layer 113. The common line CL serves to apply a common voltage to the plurality of sub-pixels SPX. The common line CL may be formed of the same material as the gate electrode 151 of the transistor 150, but is not limited thereto.

Referring to FIG. 2 and FIG. 3, the connection lines 180 refer to lines that electrically connect pads on the plurality of first substrates 111 or the plurality of second substrates 121. The connection lines 180 are disposed on the first substrate 111 and the plurality of connection supports 120.

The connection lines 180 include a first connection line 181 and a second connection line 182. The first connection line 181 and the second connection line 182 are disposed between the plurality of first substrates 111. Specifically, the first connection line 181 refers to a line extended in an X-axis direction between the plurality of first substrates 111 among the connection lines 180. The second connection line 182 refers to a line extended in a Y-axis direction between the plurality of first substrates 111 among the connection lines 180. The X-axis direction and Y-axis direction are positioned in a plane parallel to the display surface and are referenced to the typical viewing orientation.

The connection lines 180 may be formed of a metal material such as copper (Cu), aluminum (Al), titanium (Ti), or molybdenum (Mo). The connection lines 180 may have a metal-laminated structure of copper/molybdenum-titanium (Cu/MoTi), titanium/aluminum/titanium (Ti/Al/Ti), or the like, but are not limited thereto.

In a general organic light-emitting display device, various lines such as a plurality of gate lines and a plurality of data lines are extended in a straight line and disposed between a plurality of sub-pixels. Also, a single signal line is connected to a plurality of sub-pixels. Therefore, in the general organic light-emitting display device, various lines such as a gate line, a data line, a high-potential power line, and a reference voltage line, are continuously extended on a substrate from one side to the other side of the organic light-emitting display device.

However, in the stretchable display device 100 according to an example embodiment of the present disclosure, various lines, such as a gate line, a data line, a high-potential power line, and a reference voltage line, which are formed in a straight line and have been used in the general organic light-emitting display device are disposed only on the plurality of first substrates 111 and the plurality of second substrates 121. That is, in the stretchable display device 100 according to an example embodiment of the present disclosure, various lines formed in a straight line are disposed only on the plurality of first substrates 111 and the plurality of second substrates 121.

In the display device 100 according to an example embodiment of the present disclosure, pads on two adjacent first substrates 111 or second substrates 121 may be connected by the connection lines 180 to connect discontinuous lines on the first substrates 111 or second substrates 121. That is, the connection lines 180 electrically connect pads on two adjacent first substrates 111, two adjacent second substrates 121, and a first substrate 111 and a second substrate 121 adjacent to each other. Therefore, the stretchable display device 100 according to an example embodiment of the present disclosure may include the plurality of connection lines 180. The plurality of connection lines 180 serves to electrically connect various lines, such as a gate line, a data line, a high-potential power line, and a reference voltage line, between the plurality of first substrates 111, between the plurality of second substrates 121, and between the plurality of first substrates 111 and the plurality of second substrates 121. For example, a gate line may be disposed on the plurality of first substrates 111 disposed adjacent to each other in the X-axis direction and the gate pads 171 may be disposed on both ends of the gate line. In this case, a plurality of gate pads 171 on the plurality of first substrates 111 disposed adjacent to each other in the X-axis direction may be connected to each other by the first connection line 181 serving as a gate line. Therefore, a gate line disposed on the plurality of first substrates 111 and the first connection line 181 disposed on the substrate 121 may serve as a single gate line. Further, lines, for example, a light signal line, a low-potential power line, a high-potential power line, are extended in the X-axis direction among all the various lines which can be included in the stretchable display device 100. These lines may also be electrically connected by the first connection line 181 as described above.

Referring to FIG. 2 and FIG. 3, the first connection line 181 may connect pads on two first substrates 111 disposed parallel to each other among pads on a plurality of first substrates 111 disposed adjacent to each other in the X-axis direction. The first connection line 181 may serve as a gate line, a light signal line, a high-potential power line, or a low-potential power line, but is not limited thereto. For example, the first connection line 181 may serve as a gate line and electrically connect gate pads 171 on two first substrates 111 disposed parallel to each other in the X-axis direction. Therefore, as described above, the gate pads 171 on the plurality of first substrates 111 disposed in the X-axis direction may be connected by the first connection line 181 serving as a gate line. A gate signal may be transferred to the gate pads 171.

Referring to FIG. 2, the second connection line 182 may connect pads on two first substrates 111 disposed parallel to each other among pads on a plurality of first substrates 111 disposed adjacent to each other in the Y-axis direction. The second connection line 182 may serve as a data line, a high-potential power line, a low-potential power line, or a reference voltage line, but is not limited thereto. For example, the second connection line 182 may serve as a data line and electrically connect data lines DL on two first substrates 111 disposed parallel to each other in the Y-axis direction. Therefore, as described above, the data lines DL on the plurality of first substrates 111 disposed in the Y-axis direction may be connected by a plurality of second connection lines 182 serving as data lines. A data signal may be transferred to the data lines DL.

Referring to FIG. 1, the connection lines 180 may further include a line that connect pads on the plurality of first substrates 111 and the plurality of second substrates 121. The line may connect pads on two second substrates 121 disposed in parallel to each other among the plurality of second substrates 121 disposed adjacent to each other in the Y-axis direction.

The first connection line 181 is in contact with an upper surface and a side surface of the overcoating layer 115 disposed on the first substrate 111 and may be extended to an upper surface of the second substrate 120. Also, the second connection line 182 is in contact with the upper surface and the side surface of the overcoating layer 115 disposed on the first substrate 111 and may be extended to the upper surface of the second substrate 120. The layout of the first connection line 181 and the second connection line 182 and the effect thereof will be described in detail.

Referring to FIG. 3, a bank 116 is formed on a first connection pad 191, a second connection pad 192, the connection lines 180, and the overcoating layer 115. The bank 116 separates adjacent sub-pixels SPX from each other.

The bank 116 is disposed to cover a part of the second connection line 182 and first connection pad 191 adjacent thereto or at least a part of the first connection line 181 and second connection pad 192. The bank 116 may be formed of an insulating material. Further, the bank 116 may contain a black material. Since the bank 116 contains a black material, the bank 116 serves to hide lines which can be seen through the active area AA. The bank 116 may be formed of, for example, a transparent carbon-based mixture. Specifically, the bank 116 may contain carbon black, but is not limited thereto. The bank 116 may also be formed of a transparent insulating material.

Referring to FIG. 3, an LED 160 is disposed on the first connection pad 191 and the second connection pad 192. The LED 160 includes an n-type layer 161, an active layer 162, a p-type layer 163, an n-electrode 164, and a p-electrode 165. The LED 160 of the display device 100 according to an example embodiment of the present disclosure has a flip-chip structure in which the n-electrode 164 and the p-electrode 165 are formed on its one side surface.

The n-type layer 161 may be formed by injecting n-type impurities into gallium nitride (GaN) having excellent crystallinity. The n-type layer 161 may be disposed on a separate base substrate which is formed of a light-emitting material.

The active layer 162 is disposed on the n-type layer 161. The active layer 162 is a light-emitting layer in the LED 160 and may be formed of a nitride semiconductor, for example, indium gallium nitride (InGaN). The p-type layer 163 is disposed on the active layer 162. The p-type layer 163 may be formed by injecting p-type impurities into gallium nitride (GaN).

The LED 160 according to an example embodiment of the present disclosure is manufactured by sequentially laminating the n-type layer 161, the active layer 162, and the p-type layer 163, etching a predetermined region, and forming the n-electrode 164 and the p-electrode 165. In this case, the predetermined region is a space to separate the n-electrode 164 and the p-electrode 165 and is etched to expose a part of the n-type layer 161. In other words, a surface of the LED 160 on which the n-electrode 164 and the p-electrode 165 are to be disposed may not be flat but may have different levels of height.

The n-electrode 164 is disposed on the etched region, i.e., on the n-type layer 161 which is exposed by etching. The n-electrode 164 may be formed of a conductive material. Meanwhile, the p-electrode 165 is disposed on the non-etched region, i.e., on the p-type layer 163. The p-electrode 165 may be formed of a conductive material. For example, the p-electrode 165 may be formed of the same material as the n-electrode 164.

An adhesive layer AD is disposed on upper surfaces of the first connection pad 191 and the second connection pad 192 and between the first connection pad 191 and the second connection pad 192. Thus, the LED 160 can be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer formed by dispersing conductive balls in an insulating base member. Thus, when heat or pressure is applied to the adhesive layer AD, the conductive balls are electrically connected in a region applied with heat or pressure. Therefore, the pressed region may have conductive properties, and a non-pressed region may have insulating properties. For example, the n-electrode 164 is electrically connected to the second connection line 182 through the adhesive layer AD, and the p-electrode 165 is electrically connected to the first connection line 181 through the adhesive layer AD. That is, the adhesive layer AD may be coated on the first connection pad 191 and the second connection pad 192 by inkjet or other methods. Then, the LED 160 may be transferred onto the adhesive layer AD. Then, the LED 160 may be pressed and heated to electrically connect the first connection pad 191 to the p-electrode 165 and the second connection pad 192 to the n-electrode 164. The adhesive layer AD except a part of the adhesive layer AD between the n-electrode 164 and the second connection pad 192 and a part of the adhesive layer AD between the p-electrode 165 and the first connection pad 191 has insulating properties. Meanwhile, the adhesive layer AD may be separated, and each may be disposed on each of the first connection pad 191 and the second connection pad 192.

As such, the display device 100 according to an example embodiment of the present disclosure has a structure in which the LED 160 is disposed on the lower substrate 110 in which the transistor 150 is disposed. Thus, when the display device 100 is turned on, different levels of voltage are applied to the first connection pad 191 and the second connection pad 192, respectively. The voltages are transferred to the n-electrode 164 and the p-electrode 165 so that the LED 160 can emit light.

Referring to FIG. 3, an upper substrate US is disposed on the bank 116, the LED 160, and the lower substrate 110.

The upper substrate US serves to support various components disposed under the upper substrate US. Specifically, the upper substrate US may be formed by coating and hardening a material of the upper substrate US on the lower substrate 110 and the first substrate 111. Further, the upper substrate US may be disposed to be in contact with the lower substrate 110, the first substrate 111, the second substrate 120, and the connection lines 180.

The upper substrate US is a ductile or flexible substrate and may be formed of an insulating material which can be bent or stretched. The upper substrate US is a ductile substrate and can be reversibly expanded and contracted. Further, the upper substrate US may have an elastic modulus ranging from several MPa to several hundreds of MPa and may have a stretch failure of 100% or more. The thickness of the upper substrate US may be from 10 μm to 1 mm, but is not limited thereto.

The upper substrate US may be formed of the same material as the lower substrate 110. For example, the upper substrate US may be formed of silicone rubber such as polydimethylsiloxane (PDMS) and an elastomer such as polyurethane (PU). Thus, the upper substrate US may have flexibility. However, the materials of the upper substrate US are not limited thereto.

Meanwhile, although not illustrated in FIG. 3, a polarizing layer may also be disposed on the upper substrate US. The polarizing layer polarizes light incident from the outside of the stretchable display device 100 and suppresses reflection of external light. Further, instead of the polarizing layer, another optical film or the like may be disposed on the upper substrate US.

In a conventional stretchable display device, an overcoating layer formed of an organic insulating material does not cover side surfaces of a plurality of inorganic insulating layers including a buffer layer, a gate insulating layer, and an interlayer insulating layer. Instead, the overcoating layer is disposed on the plurality of inorganic insulating layers. Thus, connection lines are disposed to be in contact with the side surfaces of the plurality of inorganic insulating layers. However, when a patterning process, i.e., an etching process, is performed to the plurality of inorganic insulating layers, a step may be formed on the side surfaces of the plurality of inorganic insulating layers. That is, the side surfaces of the plurality of inorganic insulating layers have a very high incline angle after the etching process. Therefore, if the connection lines are formed directly on the side surfaces of the plurality of inorganic insulating layers, line opening may occur in the connection lines.

In the stretchable display device 100 according to an example embodiment of the present disclosure, the overcoating layer 115 is disposed to cover the side surfaces of the plurality of inorganic insulating layers, such as the buffer layer 112, the gate insulating layer 113, and the interlayer insulating layer 114, between the first substrate 111 and the overcoating layer 115. Thus, the overcoating layer 115 can compensate for a step on the side surfaces of the buffer layer 112, the gate insulating layer 113, and the interlayer insulating layer 114. That is, the overcoating layer 115 is disposed to cover the upper surfaces and the side surfaces of the buffer layer 112, the gate insulating layer 113, and the interlayer insulating layer 114. Also, the incline angle θ2 of the side surface of the overcoating layer 115 may be lower than the incline angle θ1 of the side surfaces of the buffer layer 112, the gate insulating layer 113, and the interlayer insulating layer 114. That is, the side surface of the overcoating layer 115 may have a lower incline angle than the side surface of the interlayer insulating layer 114, the side surface of the gate insulating layer 113, and the side surface of the buffer layer 112. Thus, the connection lines 180 in contact with the side surface of the overcoating layer 115 are disposed with a low incline angle. Therefore, when the connection lines 180 are formed, the occurrence of cracks in the connection lines 180 can be suppressed. Also, when the stretchable display device 100 is stretched, stress generated on the connection lines 180 can be reduced. Further, it is possible to suppress cracks in the connection lines 180 or peeling of the connection lines 180 from the side surface of the overcoating layer 115.

Meanwhile, in the stretchable display device 100 according to an example embodiment of the present disclosure, the connection lines 180 may have the same shape as the second substrate 120 and thus may have a sine wave shape. Therefore, a resistance of the connection lines 180 may increase compared to the case where the connection lines 180 have a straight line shape. Thus, copper (Cu) having low resistance among various metal materials which can be used for lines may be used for the connection lines 180 to reduce a resistance of the connection lines 180. However, when Cu or other low-resistance metal materials are formed on an inorganic insulating layer, there may be a problem with adhesion strength between the metal materials and the inorganic insulating layer. That is, Cu or other low-resistance metal materials have small adhesion strength with respect to the inorganic insulating layer. Thus, if the connection lines 180 are disposed to be in contact with the side surface of the plurality of inorganic insulating layers such as the buffer layer 112, the gate insulating layer 113, and the interlayer insulating layer 114, the connection lines 180 may peel off from the side surface of the buffer layer 112, the gate insulating layer 113, and the interlayer insulating layer 114 when the stretchable display device 100 is stretched. Therefore, the reliability of the stretchable display device 100 may be degraded.

Therefore, in the stretchable display device 100 according to an example embodiment of the present disclosure, the overcoating layer 115 is disposed to cover the side surfaces of the buffer layer 112, the gate insulating layer 113, and the interlayer insulating layer 114. Thus, when the stretchable display device 100 is stretched repeatedly, it is possible to suppress peeling of the connection lines 180 from the overcoating layer 115 and the side surfaces of the plurality of inorganic insulating layers. More specifically, the connection lines 180 formed of Cu or other low-resistance metal materials are disposed on the upper surface and the side surface of the overcoating layer 115 formed of an organic insulating material. Thus, the adhesion strength of lower parts of the connection lines 180 can be enhanced. Therefore, in the stretchable display device 100 according to an example embodiment of the present disclosure, the overcoating layer 115 is disposed to cover the side surfaces of the plurality of inorganic insulating layers, such as the buffer layer 112, the gate insulating layer 113, and the interlayer insulating layer 114, on the first substrate 111. Thus, when the stretchable display device 100 is stretched repeatedly, it is possible to suppress peeling of the connection lines 180 from the overcoating layer 115. Therefore, the reliability of the stretchable display device 100 can be improved.

Further, in the stretchable display device 100 according to an example embodiment of the present disclosure, the overcoating layer 115 is disposed on the plurality of inorganic insulating layers, such as the buffer layer 112, the gate insulating layer 113, and the interlayer insulating layer 114, and the transistor 150. Thus, when the LED 160 is transferred, it is possible to protect components disposed under the overcoating layer 115. When the LED 160 is disposed on the stretchable display device 100, the LED 160 may be pressed from above the stretchable display device 100. In this case, the transistor 150, various lines, and the connection lines 180 disposed under the LED 160 might be damaged by pressure if not protected. Therefore, the overcoating layer 115 is disposed on the buffer layer 112, the gate insulating layer 113, the interlayer insulating layer 114, and the transistor 150. Accordingly, when the LED 160 is transferred, stress caused by pressing on the transistor 150 can be reduced. Thus, damage to the transistor 150, various lines, the connection lines 180, and the like, disposed under the overcoating layer 115 can be reduced.

The overcoating layer 115 can also be somewhat ductile. It can have a modulus of elasticity that is between that of the connection support 120 and the inorganic layer 114. It has slightly more ability to stretch than the glass that makes up layers 112, 113 and 114, which also aids to reduce the stress and peeling of the connection lines 180 when the display is stretched. The overcoating layer 115 can therefore as a type of buffer layer between the connection lines 180 and their connection to the first substrate 111 and second substrate 121, accommodating some of the movement and stretch of the connection lines 180 as the display is stretched.

One acceptable method of making the display device 100 will now be described. As previously stated, the lower substrate 110 is a substrate for supporting and protecting various components of the stretchable display device 100. The lower substrate 110, which is a flexible substrate, may be made of a bendable or stretchable insulating material. For example, the lower substrate 110 may be made of silicon rubber such as polymethylsiloxane (PDMS) or an elastomer such as polyurethane (PU), so it may have flexibility. The material of the lower substrate 110, however, is not limited thereto. The lower substrate 110, which is a flexible substrate, may reversibly expand and contract. The lower substrate 110 may have an elastic modulus of several to hundreds of MPa and a tensile fracture rate of 100% or more. The elastic modulus may be referred to herein either as the elastic modulus or in some instances, as the modulus. The thickness of the lower substrate 110 may be 10 μm to 1 mm, but is not limited thereto. The first substrates 111 and second substrates 121 are made separately from the lower substrate 110. In one embodiment, though not required in all embodiments, all layers on the substrate 111, are formed in full, having layer 115 and all parts of the LED 160 present. In such embodiments, they also contain second connection pad 192 and all other connection pads, such as 171 and 172. They do not contain connection lines 180 as formed.

In another embodiment, the overcoating layer 115 is not present on the individual substrates 111 separately formed and it is deposited overlying the entire substrate 110 after the connection support 120 is deposited and formed. These substrates 111 and 121 are rigid substrates and their properties and relationship to the lower substrate are described in more detail in pending application U.S. application Ser. No. 16/590,083, filed on Oct. 1, 2019 and having the same assignee as the present application.

In one embodiment, after the rigid substrates 111 and 121, as fully formed substrates as described, are placed on the lower substrate 110. After this a connection layer material can be deposited between the substrates 111 and 121. Alternatively, the connection layer material can be blanket deposited on the entire lower substrate, overlying each of the substrates 111 and 121 that have been previously placed on the lower substrate 110. After this, an electrically conductive layer is blanket deposited on the exposed surfaces of the entire lower substrate, overlying each of the substrates 111 and 121 and the connection layer 120. The electrically conductive layer is then patterned and etched to form the connection lines 181 and 182. The same pattern that used to etch the connection lines 181 and 182 will then be used to etch the connection layer, which will result in forming the connection support 120 have the same shape and exactly under the connection lines 181 and 182. One technique to accomplish this is to use an etch chemistry that will etch both layers at the same time, namely, the conductive layer comprising the lines 181 and 182 and connection layer that comprises the connection support 120. In this embodiment, the etch chemistry selected will be one that does not etch the material that is exposed as the upper surface first and second substrates 111 and 121.

A different technique that can be used is to etch the conductive layer to form the connection lines 181 and 182 with an etch chemistry that is selective to etch them, but will not etch other exposed areas on the display 100. After this, using the lines 181 and 182 as the mask, the support layer is etched to form the connection supports 120 to have the very same shape as the lines 181 and 182.

The connection layer can be made of any acceptable material that will be used for the connection supports 120. One acceptable material is polyimide, also referred to as PI. PI is an organic material. It can take many forms and can be constructed to be somewhat flexible. In one embodiment, though not required in all embodiments, the polyimide that makes up the connection supports 120 can be constructed to have a modulus of elasticity that greater than that of the lower substrate 110, but less than that of silicon nitride or silicon oxide that comprise layers 112, 113 and 114. It can therefore be slightly stretched, more than the glass layer of silicon nitride or silicon dioxide that will comprise layers 112, 113 and 114. Thus, it can act as intermediate layer of flexibility, having a modulus of elasticity that is between that of the lower substrate 110 and first substrate 111. It can also have a modulus of elasticity that is between that of the lower substrate 110 and the overcoating layer 115.

Since the connection supports 120 are made of polyimide, they can be etched by a different etch chemistry than the layers that make up the first substrate 111 and second substrate 121. In addition, it is more flexible and has a softer upper surface than the inorganic glass layers 112, 113 and 114 since it is comprised of PI.

The connection lines 180 therefore are in contact with and rest on organic material as they extend from one first substrate 111 to the adjacent first substrate 111. Further, the flexibility, as measured by the modulus of elasticity, will be less than that of the inorganic layer 112. In a preferred embodiment, the modulus of elasticity will be gradual change from one material to another on which it rests. The connection lines 180 are positioned on the organic layer 120 between the first substrates 111 that have a first selected modulus of elasticity, then, when they are over first substrate 111, they are positioned on overcoating layer 115 that has a second selected modulus of elasticity that is greater than that of connection support 120 and less than that of the pads 171 and 172 that are on the layer 114.

Figure 4A:
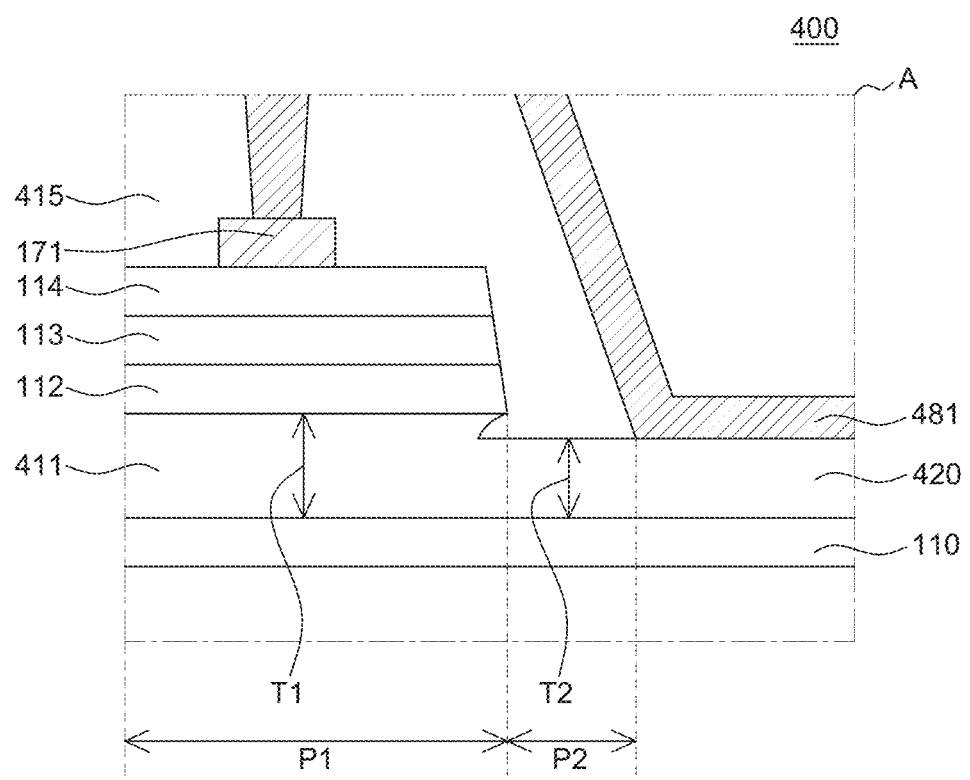
FIG. 4A is an enlarged cross-sectional view illustrating a stretchable display device according to another example embodiment of the present disclosure.

FIG. 4A is an enlarged cross-sectional view illustrating a stretchable display device according to another example embodiment of the present disclosure. A stretchable display device 400 shown in FIG. 4A is substantially the same as the stretchable display device 100 shown in FIG. 1 through FIG. 3 except a plurality of first substrates 411, a plurality of connection supports 420, an overcoating layer 415, and connection lines. Therefore, redundant description of the same components will not be provided. FIG. 4A illustrates only a region A of FIG. 3 for convenience of explanation. Also, FIG. 4A illustrates only a first connection line 481 among the connection lines, and the same may apply to a second connection line.

Referring to FIG. 4A, the plurality of first substrates 411 includes a first part P1 and a second part P2. The first part P1 is a region where the plurality of inorganic insulating layers such as the buffer layer 112, the gate insulating layer 113, and the interlayer insulating layer 114 is disposed. The second part P2 is a region covered by the overcoating layer 415. The first part P1 may have a first thickness T1, and the second part P2 may have a second thickness T2 which is smaller than the first thickness T1 of the first part P1. In this case, the first thickness T1 may be a distance between upper surfaces of the plurality of first substrates 411 in contact with the buffer layer 112 and lower surfaces of the plurality of first substrates 411 in contact with the lower substrate 110.

Referring to FIG. 4A, the plurality of connection supports 420 may be connected to the second part P2 of the plurality of first substrates 411, and the first connection line 481 may be disposed on upper surfaces of the plurality of connection supports 420. In this case, the plurality of connection supports 420 may have the same thickness as the second part P2 of the plurality of first substrates 411.

Referring to FIG. 4A, the first part P1 adjacent to the second part P2 may have an undercut portion. Specifically, during manufacturing of the stretchable display device 400, the second part P2 of the plurality of first substrates 411 and the plurality of inorganic insulating layers, such as the buffer layer 112, the gate insulating layer 113, and the interlayer insulating layer 114, on the plurality of connection supports 420 may be etched and removed. This may occur when etching to form the connection lines 181 and 182 on the plurality of connection supports 420 as described herein or when etching the connection line 120. Thus, in the embodiment in which the overcoating layer 115 is deposited after the connection line 120 is formed, the undercut will be present. Namely, when the plurality of inorganic insulating layers is etched, the second part P2 of the plurality of first substrates 411 and a part of the upper surfaces of the plurality of connection supports 420 may also be slightly etched and therefore part of it is removed. Thus, the first part P1 adjacent to the second part P2 may have an undercut portion, i.e., a shape whose cross-sectional area or width gradually decreases from top to bottom. Also, the second part P2 and the plurality of connection supports 420 may have a smaller thickness than the first part P1.

Referring to FIG. 4A, the overcoating layer 415 may be disposed in the first part P1 adjacent to the second part P2 to compensate for the undercut portion of the first part P1 adjacent to the second part P2. That is, the overcoating layer 415 may fill a space under an upper surface of the first part P1, and, thus, the first connection line 481 cannot be disposed on the undercut portion. Thus, the overcoating layer 415 can suppress line opening in the first connection line 481.

Figure 4B:
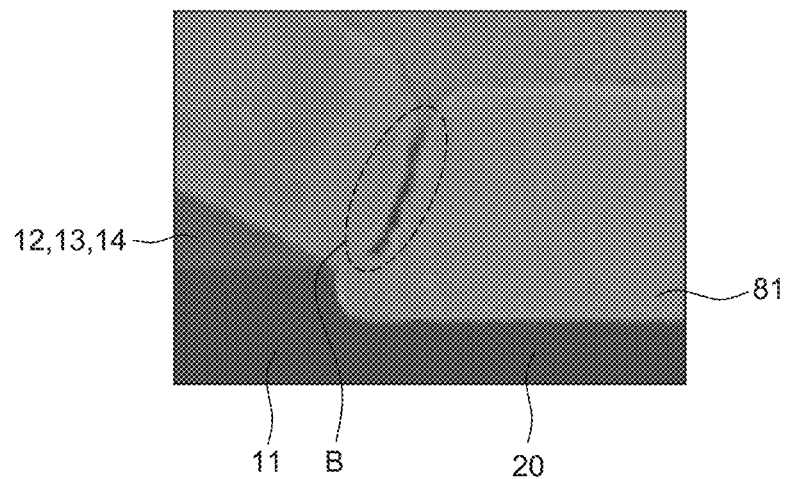
FIG. 4B is an image of a stretchable display device according to Comparative Example.

FIG. 4B is an image of a stretchable display device according to Comparative Example. It is assumed that in the stretchable display device shown in FIG. 4B, a plurality of first substrates 11 and a plurality of connection supports 20 are formed of PI and a plurality of inorganic insulating layers including a buffer layer 12, a gate insulating layer 13, and an interlayer insulating layer 14 is formed of SiNx. Also, it is assumed that in the stretchable display device shown in FIG. 4B, a first connection line 81 is formed of Cu. Further, a thickness of the plurality of first substrates 11 is set to 6 μm and the total thickness of the buffer layer 12, the gate insulating layer 13, and the interlayer insulating layer 14 is set to 3600 Å. Also, a thickness of the first connection line 81 is set to 5000 Å. Moreover, it is assumed that the buffer layer 12, the gate insulating layer 13, and the interlayer insulating layer 14 are disposed on the plurality of first substrates 11, and the first connection line 81 is disposed on the plurality of first substrates 11 and the plurality of connection supports 20.

Referring to FIG. 4B, while the buffer layer 12, the gate insulating layer 13, and the interlayer insulating layer 14 are etched, some of the plurality of first substrates 11 adjacent to the plurality of connection supports 20 and some of the plurality of connection supports 20 are also etched. Thus, it can be seen that a part of the plurality of first substrates 11 adjacent to the plurality of connection supports 20 has an undercut portion and the plurality of connection supports 20 has a smaller thickness than the plurality of first substrates 11.

Further, referring to FIG. 4B, the first connection line 81 may be disposed in a region of the plurality of first substrates 11 where the undercut portion is formed. However, if the first connection line 81 is disposed along the undercut portion of the plurality of first substrates 11, line opening may occur in the first connection line 81 due to a step on the undercut portion as indicated by B region in FIG. 4B.

In the stretchable display device 400 according to another example embodiment of the present disclosure, the overcoating layer 415 is disposed to cover the second part P2 of the plurality of first substrates 411 and the first part P1 adjacent to the second part P2. Thus, when a connection line is formed, it is possible to suppress line opening in the connection line. Specifically, while the buffer layer 112, the gate insulating layer 113, and the interlayer insulating layer 114 are etched, the first part P1 adjacent to the second part P2 of the plurality of first substrates 411 may also be etched. Thus, the first part P1 adjacent to the second part P2 may have an undercut portion. The overcoating layer 415 may be disposed to cover the second part P2 of the plurality of first substrates 411 and the first part P1 adjacent to the second part P2. Therefore, the overcoating layer 415 can compensate for the undercut portion of the first part P1 adjacent to the second part P2. Also, since the connection line is disposed on the overcoating layer 415, it is possible to suppress line opening in the connection line when the connection line is formed.

In other embodiments, the entire individual substrates 111 are fully formed, including the overcoating layer 115 and the light emitting element 160 and then it is placed on the lower substrate 110. In such embodiments, an undercut of the sidewall of inorganic layer 112 will not be present.

Figure 5:
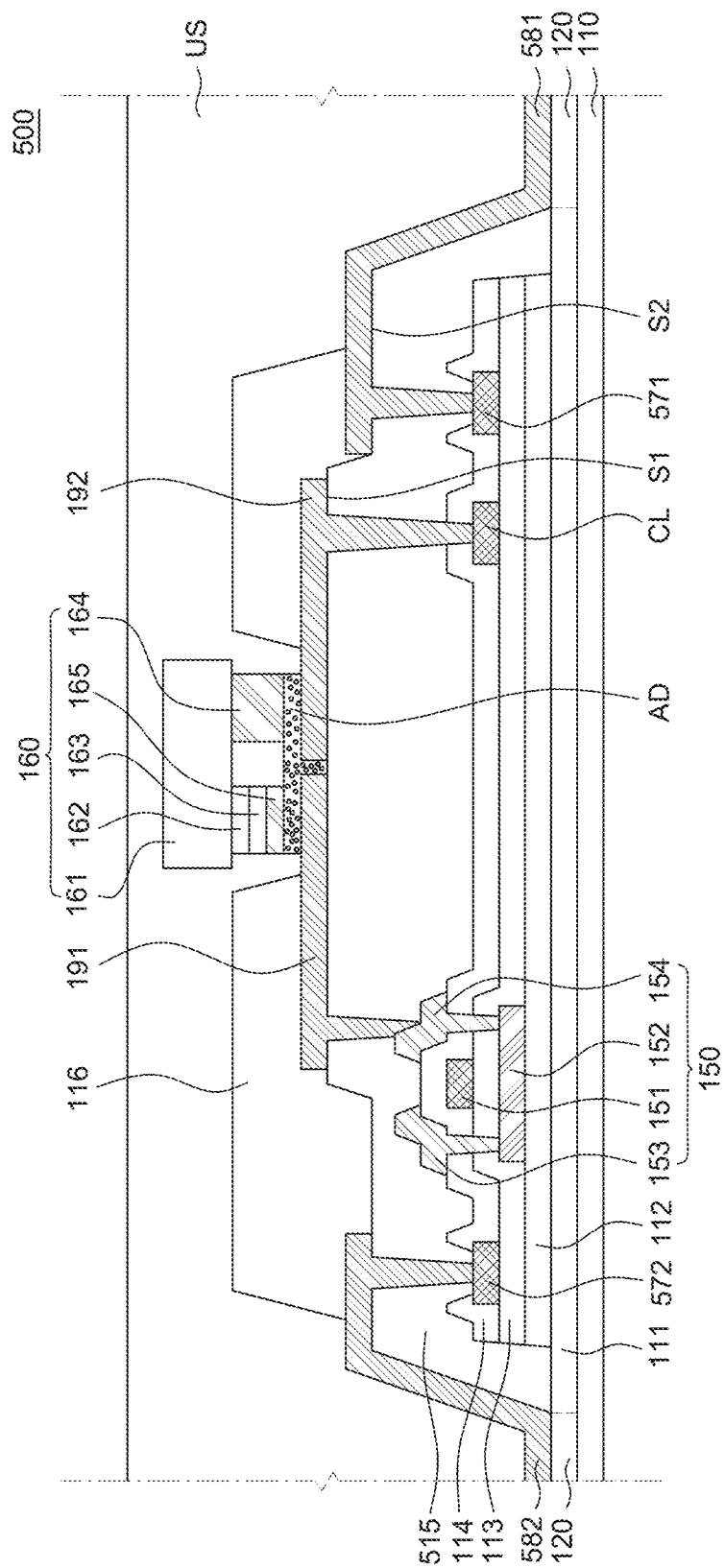
FIG. 5 is a schematic cross-sectional view illustrating a sub-pixel of a stretchable display device according to yet another example embodiment of the present disclosure.

FIG. 5 is a schematic cross-sectional view illustrating a sub-pixel of a stretchable display device according to yet another example embodiment of the present disclosure. A stretchable display device 500 shown in FIG. 5 is substantially the same as the stretchable display device 100 shown in FIG. 1 through FIG. 3 except an overcoating layer 515, a plurality of pads 570, and a plurality of connection lines 580. Therefore, redundant description of the same components will not be provided.

Referring to FIG. 5, the plurality of pads 570 is disposed on the same layer as the gate electrode 151 which is an electrode of the transistor 150. Specifically, the plurality of pads 570 may be disposed on the gate insulating layer 113 and connected to the connection lines 580 through contact holes formed in the interlayer insulating layer 114 and the overcoating layer 515. More specifically, a gate pad 571 among the plurality of pads 570 may be connected to a first connection line 581 and a data pad 572 may be connected to a second connection line 582.

Referring to FIG. 5, the overcoating layer 515 includes a first surface S1 and a second surface S2 formed lower in height than the first surface S1. On the first surface S1 of the overcoating layer 515, a first connection pad 191 and a second connection pad 192 may be disposed. On the second surface S2, the first connection line 581 and the second connection line 582 may be disposed. Thus, the first connection line 581 and the second connection line 582 are connected to the plurality of pads 570 at a lower position. Therefore, the first connection line 581 and the second connection line 582 may be disposed in a smaller region on a side surface of the overcoating layer 515. The overcoating layer is therefore a planarizing layer in some embodiments.

In the stretchable display device 500 according to yet another example embodiment of the present disclosure, the plurality of pads 570 is disposed on the same layer as the gate electrode 151. Thus, a step between the plurality of connection lines 580 can be reduced. That is, as shown in FIG. 5, if the plurality of pads 570 is disposed on the same layer as the gate electrode 151 which is an electrode of the transistor 150, a step between the plurality of pads 570 can be reduced. Also, the first connection line 581 and the second connection line 582 can be connected to the plurality of pads 570 at a lower position. Therefore, the first connection line 581 and the second connection line 582 are disposed on the second surface S2 of the overcoating layer 515. Thus, the plurality of connection lines 580 can be connected to the plurality of pads 570 at a lower position than the first surface S1 of the overcoating layer 515. Accordingly, in the stretchable display device 500 according to yet another example embodiment of the present disclosure, the plurality of pads 570 is disposed on the same layer as the gate electrode 151. Thus, the plurality of connection lines 580 can be electrically connected to the plurality of pads 570 at a lower position. Therefore, when the stretchable display device 500 is stretched, stress generated on the plurality of connection lines 580 can be reduced. Thus, it is possible to suppress line opening in the plurality of connection lines 580.

Figure 6:
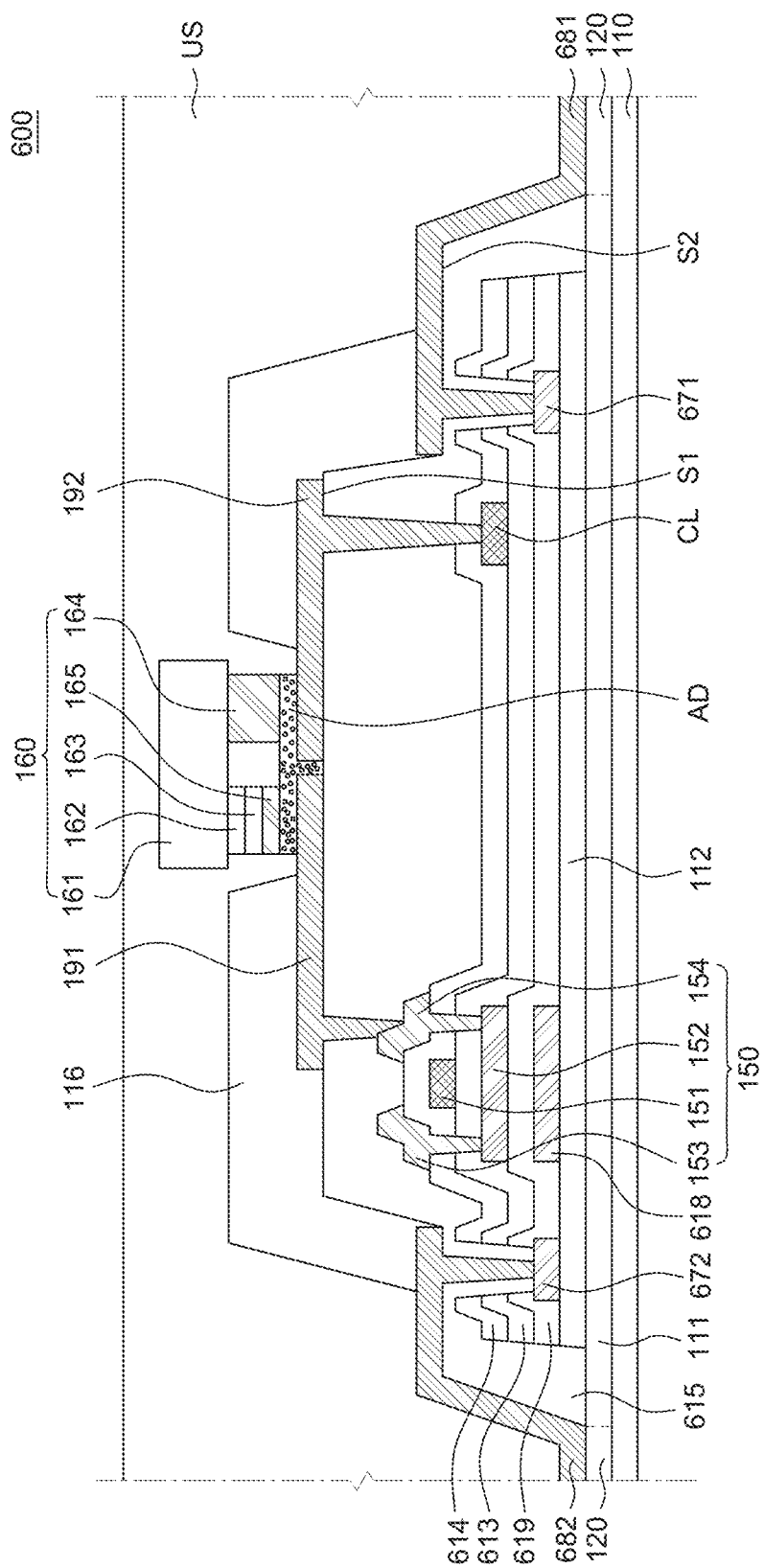
FIG. 6 is a schematic cross-sectional view illustrating a sub-pixel of a stretchable display device according to still another example embodiment of the present disclosure.

FIG. 6 is a schematic cross-sectional view illustrating a sub-pixel of a stretchable display device according to still another example embodiment of the present disclosure. A stretchable display device 600 shown in FIG. 6 is substantially the same as the stretchable display device 100 shown in FIG. 1 through FIG. 3 except a gate insulating layer 613, an interlayer insulating layer 614, an overcoating layer 615, a plurality of pads 670, and a plurality of connection lines 680. Also, a barrier shield metal (BSM) 618 and an active buffer 619 are further provided in the stretchable display device 600. Therefore, redundant description of the same components will not be provided.

Referring to FIG. 6, the BSM 618 is disposed on the buffer layer 112. The BSM 618 may be metal pattern disposed on the plurality of first substrates 111. The BSM 618 may be disposed on the plurality of first substrates 111 so as to overlap the active layer 152 of the transistor 150. A cross-sectional width of the BSM 618 may be equal to or larger than a width of the active layer 152 of the transistor 150. The BSM 618 may be formed of various metal materials. The BSM 618 may be floated or applied with a constant voltage.

The active buffer 619 is disposed on the BSM 618. The active buffer 619 serves to insulate the BSM 618 from the active layer 152 of the transistor 150. The active buffer 619 may be formed of the same material as the plurality of first substrates 111. For example, the active buffer 619 may be formed as one or more inorganic layers of silicon nitride (SiNx) or silicon oxide (SiOx).

Referring to FIG. 6, the plurality of pads 670 is disposed on the same layer as the BSM 618. That is, all of the plurality of pads 670 may be disposed on the buffer layer 112 and spaced apart from the BSM 618. For example, a gate pad 671 among the plurality of pads 670 may be disposed on the right side of the BSM 618. Also, the gate pad 671 may be connected to a first connection line 681 through a contact hole formed in the active buffer 619, the gate insulating layer 613, the interlayer insulating layer 614, and the overcoating layer 615. A data pad 672 may be disposed on the left side of the BSM 618. Also, the data pad 672 may be connected to a second connection line 682 through a contact hole formed in the active buffer 619, the gate insulating layer 613, the interlayer insulating layer 614, and the overcoating layer 615. The plurality of pads 670 may be formed of the same material as the BSM 618, but is not limited thereto.

Referring to FIG. 6, the overcoating layer 615 includes a first surface S1 and a second surface S2 formed lower in height than the first surface S1. On the first surface S1 of the overcoating layer 615, the first connection pad 191 and the second connection pad 192 may be disposed. On the second surface S2, the first connection line 681 and the second connection line 682 may be disposed. Thus, the first connection line 681 and the second connection line 682 are connected to the plurality of pads 670 at a lower position. Therefore, the first connection line 681 and the second connection line 682 may be disposed in a smaller region on a side surface of the overcoating layer 615.

The stretchable display device 600 according to still another example embodiment of the present disclosure may further include the floated BSM 618. Thus, hydrogen or moisture can be blocked by the BSM 618. Also, a laser irradiated during a laser release process can be blocked by the BSM 618. Further, the BSM 618 can suppress a shift of a threshold voltage Vth of the transistor 150 which may occur when a potential on a surface of the lower substrate 110 increases.

In the stretchable display device 600 according to still another example embodiment of the present disclosure, the plurality of pads 670 is disposed on the same layer as the BSM 618. Thus, a step between the plurality of connection lines 680 can be reduced. That is, as shown in FIG. 6, if the plurality of pads 670 is disposed on the same layer as the BSM 618, a step between the plurality of pads 670 can be reduced. Also, the first connection line 681 and the second connection line 682 can be connected to the plurality of pads 670 at a lower position. Therefore, the first connection line 681 and the second connection line 682 are disposed on the second surface S2 of the overcoating layer 615. Thus, the plurality of connection lines 680 can be connected to the plurality of pads 670 at a lower position than the first surface S1 of the overcoating layer 615. Accordingly, in the stretchable display device 600 according to still another example embodiment of the present disclosure, the plurality of pads 670 is disposed on the same layer as the BSM 618. Thus, the plurality of connection lines 680 can be electrically connected to the plurality of pads 670 at a lower position. Therefore, when the stretchable display device 600 is stretched, stress generated on the plurality of connection lines 680 can be reduced. Thus, it is possible to suppress line opening in the plurality of connection lines 680.

Figure 7:
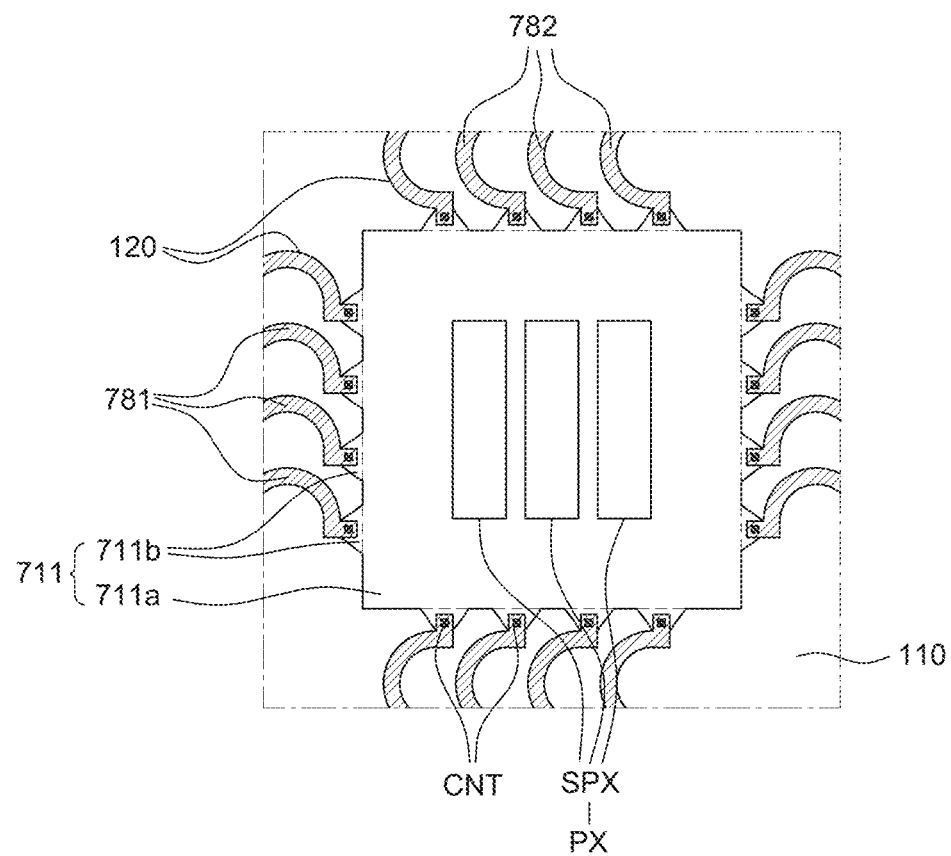
FIG. 7 is an enlarged plan view illustrating a stretchable display device according to still another example embodiment of the present disclosure.
Figure 8:
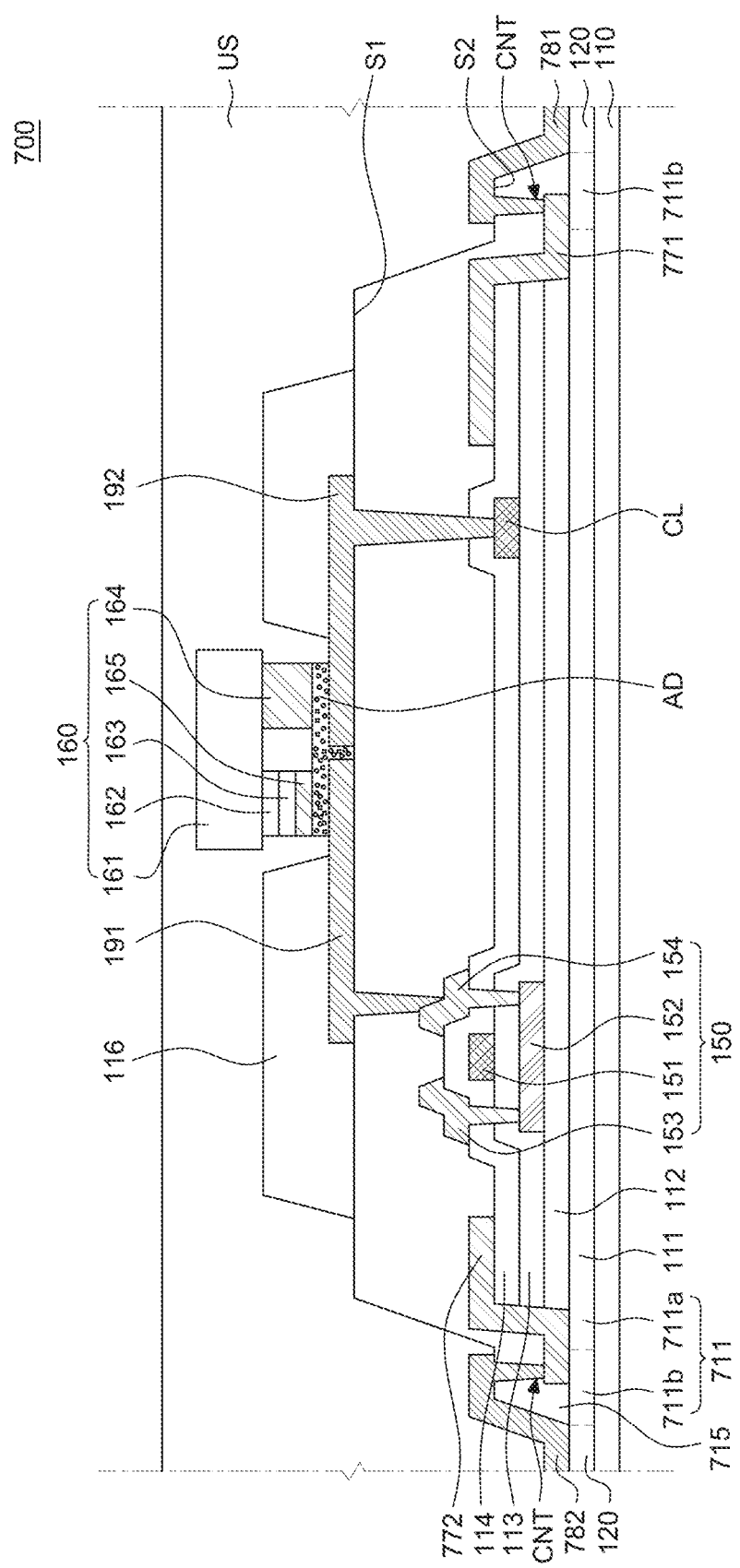
FIG. 8 is a schematic cross-sectional view illustrating a sub-pixel of a stretchable display device according to still another example embodiment of the present disclosure.

FIG. 7 is an enlarged plan view illustrating a stretchable display device according to still another example embodiment of the present disclosure. FIG. 8 is a schematic cross-sectional view illustrating a sub-pixel of the stretchable display device according to still another example embodiment of the present disclosure. A stretchable display device 700 shown in FIG. 7 and FIG. 8 is substantially the same as the stretchable display device 100 shown in FIG. 1 through FIG. 3 except a plurality of first substrates 711, a plurality of connection lines 780, and a plurality of pads 770. Therefore, redundant description of the same components will not be provided.

Referring to FIG. 7, the plurality of first substrates 711 includes a central portion 711a and a plurality of protrusions 711b protruding from the central portion 711a. The central portion 711a is a region where the sub-pixels SPX are disposed. The plurality of protrusions 711b refers to regions where a plurality of contact holes CNT is disposed. In each of the plurality of protrusions 711b, one of the plurality of contact holes CNT may be disposed. FIG. 7 illustrates that four protrusions 711b are disposed on each side of the central portion 711a, but the present disclosure is not limited thereto. The number of the plurality of protrusions 711b may vary depending on the design.

Referring to FIG. 7, the plurality of protrusions 711b may decrease in width as they become farther from the central portion 711a. Specifically, the plurality of protrusions 711b may have the largest width at a portion adjacent to the central portion 711a and the smallest width at a portion connected to the plurality of connection supports 120. In this case, the width of the plurality of protrusions 711b at the portion connected to the plurality of connection supports 120 may be equal to a width of the plurality of connection supports 120. Thus, when the stretchable display device 700 is stretched, stress generated on the plurality of protrusions 711b is dispersed. Therefore, the stability in stretching of the stretchable display device 700 can be improved.

Referring to FIG. 8, the plurality of pads 770 is disposed to be in contact with the buffer layer 112, the gate insulating layer 113, the interlayer insulating layer 114, and the plurality of first substrates 711. Specifically, the plurality of pads 770 may be disposed to be in contact with an upper surface of the interlayer insulating layer 114 and side surfaces of the buffer layer 112, the gate insulating layer 113 and the interlayer insulating layer 114. The plurality of pads 770 may also be disposed to be in contact with and upper surfaces of the plurality of first substrates 711. Since the plurality of pads 770 is disposed to be in contact with a part of the upper surfaces of the plurality of first substrates 711, the plurality of connection lines 780 can be connected to the plurality of pads 770 at a lower position.

Referring to FIG. 8, an overcoating layer 715 is disposed to cover the plurality of pads 770 and the plurality of first substrates 711. The overcoating layer 715 may be disposed to cover the upper surfaces and side surfaces of the plurality of pads 770 and the plurality of first substrates 711.

Referring to FIG. 8, the overcoating layer 715 includes a first surface S1 and a second surface S2 formed lower in height than the first surface S1. On the first surface S1 of the overcoating layer 715, the first connection pad 191 and the second connection pad 192 may be disposed. On the second surface S2 and a side surface of the overcoating layer 715, the plurality of connection lines 780 may be disposed. In this case, the contact holes CNT are formed under the second surface S2 of the overcoating layer 715. Thus, the plurality of connection lines 780 can be connected to the plurality of pads 770. Specifically, a first connection line 781 may be connected to a gate pad 771 through a contact hole CNT formed in the overcoating layer 715. Also, a second connection line 782 may be connected to a data pad 772 through a contact hole CNT formed in the overcoating layer 715.

Referring to FIG. 8, the plurality of connection supports 120 is connected to the plurality of protrusions 711b. On upper surfaces of the plurality of connection supports 120, the plurality of connection lines 780 may be disposed.

In the stretchable display device 700 according to still another example embodiment of the present disclosure, the plurality of contact holes CNT is disposed on the plurality of protrusions 711b. Thus, a pixel PX and drive circuits may be disposed in a larger region on the first substrate 711. The plurality of contact holes CNT is formed by etching a part of the overcoating layer 715 to connect the plurality of connection lines 780 to the plurality of pads 770. When the plurality of contact holes CNT is formed, a process margin between an end of the first substrate 711 and the plurality of contact holes CNT and a process margin between the pixel PX and the plurality of contact holes CNT need to be considered. Therefore, if the plurality of contact holes CNT is located in the central portion 711a, a pixel PX, drive circuits, and lines may be disposed in a smaller region on the central portion 711a. Accordingly, in the stretchable display device 700 according to still another example embodiment of the present disclosure, the plurality of contact holes CNT is disposed on the plurality of protrusions 711b. Thus, the plurality of connection lines 780 can be connected to the plurality of pads 770 on the plurality of protrusions 711b. Therefore, the pixel PX, the drive circuits, and the lines may be disposed in a larger region on the first substrate 711. For example, it is assumed that the central portion 711a of the first substrate 711 has a width of 177 μm, a contact hole CNT has a size of 5 μm×5 μm, and a process margin is 2.5 μm. In this case, if the contact hole CNT is disposed in the protrusion 711b as described in the still another example embodiment of the present disclosure, a utilized area can increase by about 11% compared to the case where the contact hole CNT is disposed in the central portion 711a.

In the stretchable display device 700 according to still another example embodiment of the present disclosure, the plurality of pads 770 is disposed to be in contact with the upper surfaces of the plurality of first substrates 711. Thus, a step between the plurality of connection lines 780 can be reduced. The plurality of pads 770 is disposed to be in contact with the upper surface of the interlayer insulating layer 114, the side surfaces of the buffer layer 112, the gate insulating layer 113 and the interlayer insulating layer 114, and the upper surfaces of the plurality of first substrates 711. Thus, the plurality of pads 770 can be in contact with the plurality of connection lines 780 on the plurality of protrusions 711b of the plurality of first substrates 711. Accordingly, in the stretchable display device 700 according to still another example embodiment of the present disclosure, the plurality of pads 770 is disposed to be in contact with the upper surfaces of the plurality of first substrates 711. Thus, the plurality of connection lines 780 may be disposed at a lower position. Therefore, when the stretchable display device 700 is stretched repeatedly, stress generated on the plurality of connection lines 780 can be reduced and damage to the plurality of connection lines 780 can be reduced.

In the stretchable display device 700 according to still another example embodiment of the present disclosure, the plurality of protrusions 711b of the plurality of first substrates 711 decreases in width as they become farther from the central portion 711a. Thus, when the stretchable display device 700 is stretched, stress generated on the plurality of protrusions 711b can be reduced at a portion connected to the central portion 711a. If the stretchable display device 700 is stretched, stress generated on the plurality of protrusions 711b is larger at the portion connected to the central portion 711a of the plurality of first substrates 711 than at the portion connected to the plurality of connection supports 120. Thus, the plurality of protrusions 711b may be damaged at the portion connected to the central portion 711a. Therefore, the plurality of protrusions 711b has a large width at the portion connected to the central portion 711a and gradually decreases in width as they become farther from the central portion 711a. Accordingly, in the stretchable display device 700 according to still another example embodiment of the present disclosure, damage to the plurality of protrusions 711b at the portion connected to the central portion 711a can be reduced.

Figure 9:
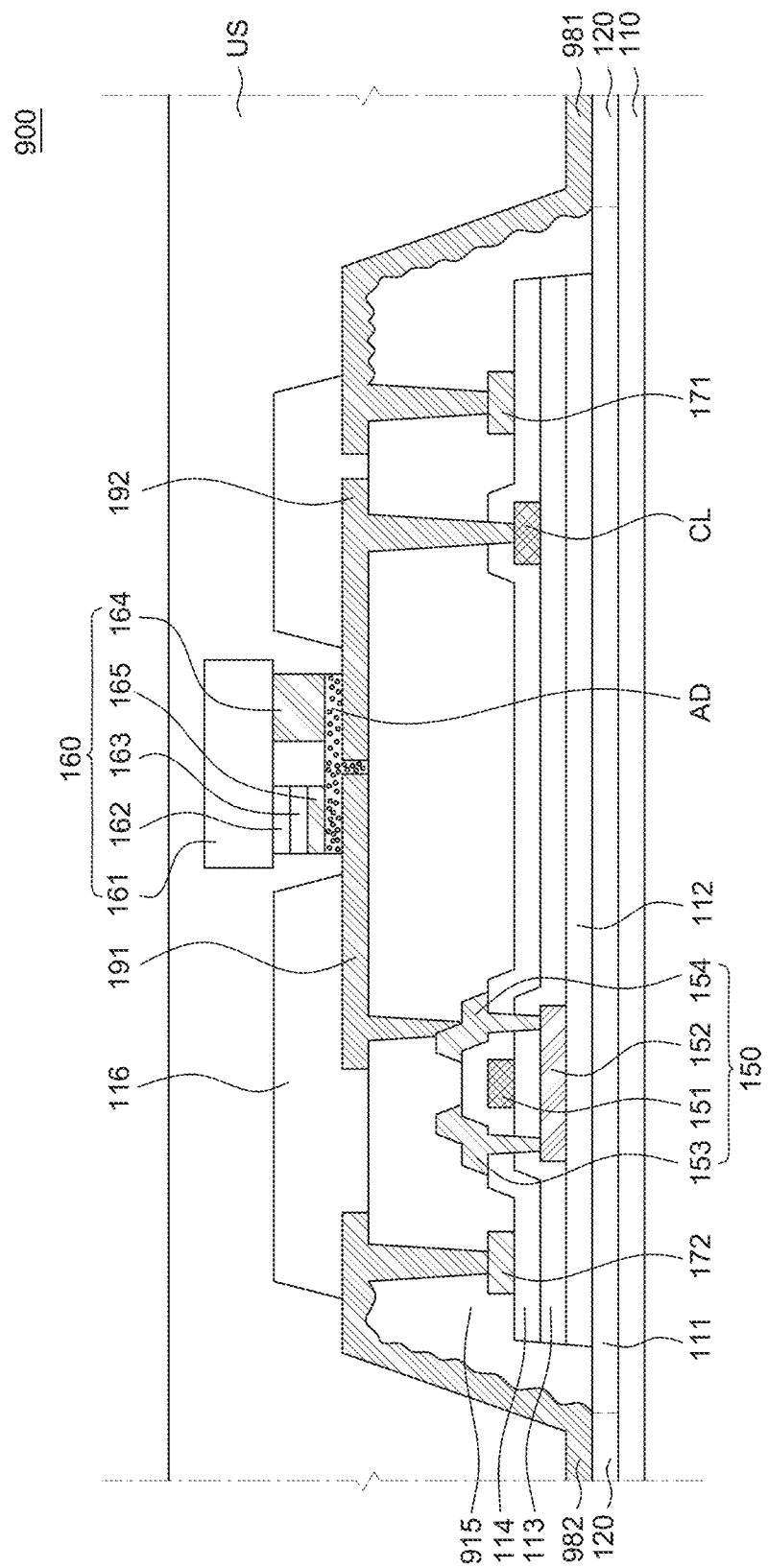
FIG. 9 is a schematic cross-sectional view illustrating a sub-pixel of a stretchable display device according to still another example embodiment of the present disclosure.

FIG. 9 is a schematic cross-sectional view illustrating a sub-pixel of a stretchable display device according to still another example embodiment of the present disclosure. A stretchable display device 900 shown in FIG. 9 is substantially the same as the stretchable display device 100 shown in FIG. 1 through FIG. 3 except an overcoating layer 915 and connection lines 980. Therefore, redundant description of the same components will not be provided.

Referring to FIG. 9, a surface of the overcoating layer 915 in contact with the plurality of connection lines 980 may be wrinkled. For example, at least a part of the overcoating layer 915 may be wrinkled with irregular creases. Thus, one surfaces of the plurality of connection lines 980 in contact with the surface the overcoating layer 915 are also wrinkled and thus can have a larger area in contact with the overcoating layer 915. FIG. 9 illustrates that the entire surface of the overcoating layer 915 in contact with the plurality of connection lines 980 is wrinkled. However, the present disclosure is not limited thereto. Only a part of the surface of the overcoating layer 915 in contact with the plurality of connection lines 980 may be wrinkled. Further, FIG. 9 illustrates that the surface of the overcoating layer 915 is wrinkled with irregular creases. However, the present disclosure is not limited thereto. The surface of the overcoating layer 915 may be wrinkled with regular creases.

In the stretchable display device 900 according to still another example embodiment of the present disclosure, the surface of the overcoating layer 915 in contact with the plurality of connection lines 980 is wrinkled. Thus, when the stretchable display device 900 is stretched, peeling of the plurality of connection lines 980 from the overcoating layer 915 can be suppressed. If the surface of the overcoating layer 915 in contact with the plurality of connection lines 980 is wrinkled, a contact area between the plurality of connection lines 980 and the overcoating layer 915 can increase. Therefore, the adhesion strength between the plurality of connection lines 980 and the overcoating layer 915 can be enhanced. Also, when the stretchable display device 900 is stretched, the wrinkled overcoating layer 915 and the connection lines 980 can be stretched more easily. Accordingly, in the stretchable display device 900 according to still another example embodiment of the present disclosure, the surface of the overcoating layer 915 in contact with the plurality of connection lines 980 is wrinkled. Thus, a contact area between the plurality of connection lines 980 and the overcoating layer 915 can increase and spare space to be used during stretching of the stretchable display device 900 can be secured. Therefore, when the stretchable display device 900 is stretched, peeling of the plurality of connection lines 980 from the overcoating layer 915 can be suppressed.

Figure 10:
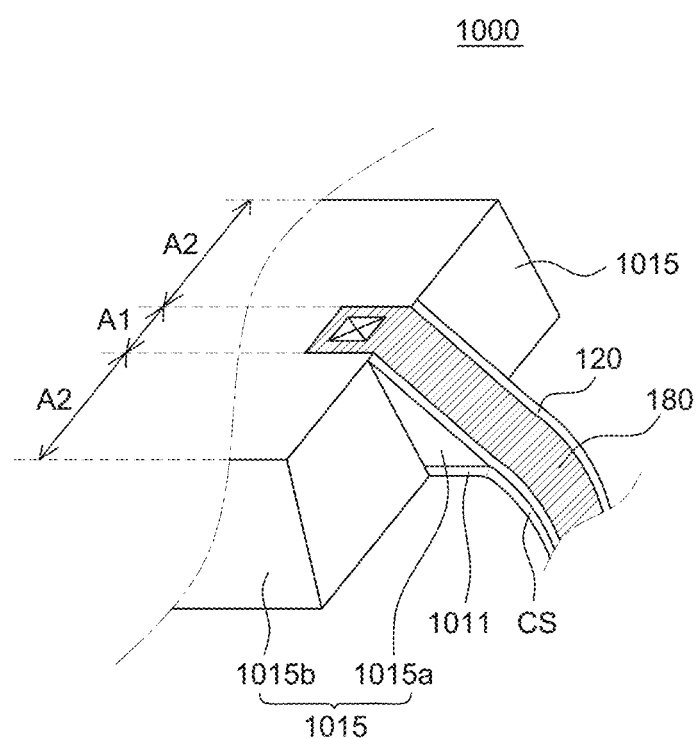
FIG. 10 is a schematic perspective view illustrating a sub-pixel of a stretchable display device according to still another example embodiment of the present disclosure.

FIG. 10 is a schematic perspective view illustrating a sub-pixel of a stretchable display device according to still another example embodiment of the present disclosure. A stretchable display device 1000 shown in FIG. 10 is substantially the same as the stretchable display device 100 shown in FIG. 1 through FIG. 3 except an overcoating layer 1015. Therefore, redundant description of the same components will not be provided. For convenience of explanation, FIG. 10 illustrates only the plurality of first substrates 111, the plurality of connection supports 120, the plurality of connection lines 180, and the overcoating layer 1015 of the stretchable display device 1000.

Referring to FIG. 10, the plurality of first substrates 111 includes a plurality of first regions A1 and a plurality of second regions A2. The plurality of first regions A1 refers to regions where the plurality of first substrates 111 and the plurality of connection supports 120 are connected to each other. The plurality of second regions A2 refers to regions other than the plurality of first regions A1. That is, the plurality of first regions A1 refers to regions where the plurality of connection lines 180 is disposed on the plurality of first substrates 111. The plurality of second regions A2 refers to regions where the plurality of connection lines 180 is not disposed.

Referring to FIG. 10, the overcoating layer 1015 may be disposed to have different incline angles in the plurality of first regions A1 and the plurality of second regions A2. Specifically, an overcoating layer 1015a disposed in the plurality of first regions A1 may have a smaller incline angle than an overcoating layer 1015b disposed in the plurality of second regions A2. Thus, the plurality of connection lines 180 disposed on the overcoating layer 1015a in the plurality of first regions A1 may be disposed to have a low incline angle.

In the stretchable display device 1000 according to still another example embodiment of the present disclosure, it is possible to selectively regulate the incline angle of the overcoating layer 1015 in the regions where the plurality of connection lines 180 is disposed. For example, the overcoating layer 1015*b* in the plurality of second regions A2 where the plurality of connection lines 180 is not disposed may be disposed to have a high incline angle. However, it is advantageous to dispose the overcoating layer 1015*a* with a low incline angle in the plurality of first regions A1 where the plurality of connection lines 180 is disposed. That is, the overcoating layer 1015*a* in the plurality of first regions A1 where the plurality of connection lines 180 is disposed has a lower incline angle than the overcoating layer 1015*b* in the plurality of second regions A2. Thus, the plurality of connection lines 180 can be disposed to have a low incline angle. Therefore, the overcoating layer 1015 in the plurality of first regions A1 is disposed with a low incline angle by selectively regulating the incline angle of the overcoating layer 1015 depending on the region. Accordingly, when the stretchable display device 1000 is stretched, damage to the plurality of connection lines 180 can be reduced.

Figure 11:
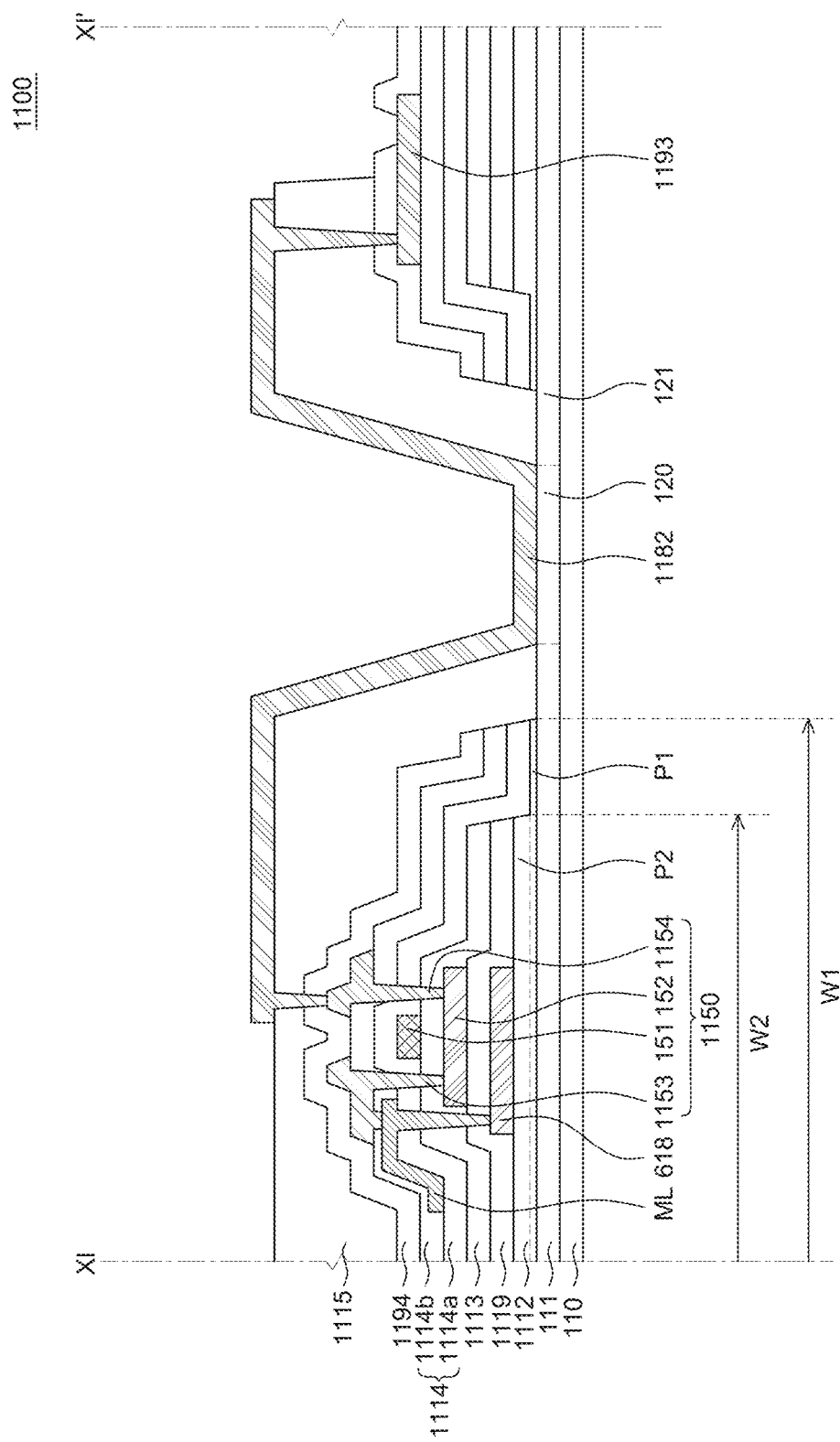
FIG. 11 is a schematic cross-sectional view as taken along a line XI-XI' of FIG. 1 illustrating a sub-pixel of a stretchable display device according to still another example embodiment of the present disclosure.

FIG. 11 is a schematic cross-sectional view as taken along a line XI-XI' of FIG. 1 according to still another example embodiment of the present disclosure. The stretchable display device 1100 shown in FIG. 11 is similar to the stretchable display device 600 shown in FIG. 6 except a plurality of inorganic insulating layers and organic insulating layers, a middle line ML and a third connection pad 1193. Therefore, redundant description of the same components that are common to both will not be provided.

Referring to FIG. 11, a plurality of inorganic insulating layers is disposed on the plurality of first substrates 111 and the plurality of second substrates 121. The plurality of inorganic insulating layers may include a buffer layer 1112, an active buffer 1119, a gate insulating layer 1113, a first interlayer insulating layer 1114*a*, a second interlayer insulating layer 1114*b* and a passivation layer 1194. A plurality of inorganic insulating layers disposed on the plurality of first substrates 111 may be disposed apart from a plurality of inorganic insulating layers disposed on the plurality of second substrates 121.

The buffer layer 1112 is disposed on the plurality of first substrates 111 and the plurality of second substrates 121. The buffer layer 1112 may be referred to as a first inorganic insulating layer. The buffer layer 1112 may include a first part P1 and a second part P2. The first part P1 of the buffer layer 1112 has a first width W1 and may be disposed to be in contact with upper surfaces of the plurality of first substrates 111. Further, the second part P2 of the buffer layer 1112 has a second width W2 and may be disposed on the first part P1. The second width W2 of the second part P2 of the buffer layer 1112 may be smaller than the first width W1 of the first part P1. That is, the buffer layer 1112 may have a stepped side surface.

The active buffer 1119 and the gate insulating layer 1113 are disposed on the buffer layer 1112. The active buffer 1119 and the gate insulating layer 1113 may be referred to as second inorganic insulating layers.

The active buffer 1119 is disposed on the buffer layer 1112. The active buffer 1119 may have the same width as the second width W2 of the second part P2 of the buffer layer 1112 and may be disposed to be in contact with an upper surface of the second part P2 of the buffer layer 1112, but is not limited thereto. The active buffer 1119 may have a smaller width than the second width W2 of the second part P2 of the buffer layer 1112.

The active layer 152 is disposed on the active buffer 1119, and the gate insulating layer 1113 is disposed on the active buffer 1119 and the active layer. The gate insulating layer 1113 may have the same width as the active buffer 1119. That is, the gate insulating layer 1113 may be formed to have the same width through the same process at the same time as the active buffer 1119. Thus, the gate insulating layer 1113 may have the same width as the second width W2 of the second part P2 of the buffer layer 1112, but is not limited thereto. The gate insulating layer 1113 may have a smaller width than the second width W2 of the second part P2 of the buffer layer 1112.

The gate electrode 151 is disposed on the gate insulating layer 1113. The gate electrode 151 may be disposed to overlap the active layer 152 or the BSM 618, but is not limited thereto.

An interlayer insulating layer 1114 and the passivation layer 1194 are disposed on the gate insulating layer 1113. The interlayer insulating layer 1114 and the passivation layer 1194 may be referred to as third inorganic insulating layers.

The interlayer insulating layer 1114 may include the first interlayer insulating layer 1114*a* and the second interlayer insulating layer 1114*b*.

The first interlayer insulating layer 1114*a* is disposed on the gate electrode 151 and the gate insulating layer 1113. The first interlayer insulating layer 1114*a* may be disposed to cover an upper surface and a side surface of the gate insulating layer 1113, a side surface of the active buffer 1119 and an upper surface and a side surface of the buffer layer 1112. In this case, the first interlayer insulating layer 1114*a* may be disposed to cover an upper surface of the first part P1 and a side surface of the second part P2 of the buffer layer 1112.

The middle line ML is disposed on the first interlayer insulating layer 1114*a*. The middle line ML may be in contact with the BSM 618 through a contact hole formed in the first interlayer insulating layer 1114*a*, the gate insulating layer 1113 and the active buffer 1119. The middle line ML serves to apply a constant voltage to the BSM 618 and electrically connects a source electrode 1153 and the BSM 618. If the middle line ML is designed to have a short length according to the design of the BSM 618 and a transistor 1150, the middle line ML may be referred to as a middle electrode.

The second interlayer insulating layer 1114*b* is disposed on the first interlayer insulating layer 1114*a* and the middle line ML. The second interlayer insulating layer 1114*b* may be disposed to cover an upper surface and a side surface of the first interlayer insulating layer 1114*a*.

The source electrode 1153, a drain electrode 1154 and a third connection pad 1193 are disposed on the second interlayer insulating layer 1114*b*.

The source electrode 1153 and the drain electrode 1154 may be electrically connected to the active layer 152 through a contact hole formed in the gate insulating layer 1113, the first interlayer insulating layer 1114*a* and the second interlayer insulating layer 1114*b*. In this case, the source electrode 1153 may be electrically connected to the active layer 152 through the middle line ML disposed on the first interlayer insulating layer 1114*a*.

The third connection pad 1193 is disposed on the second interlayer insulating layer 1114*b* formed on the plurality of second substrates 121. The third connection pad 1193 may be electrically connected to the source electrode 1153 or the drain electrode 1154 formed on the plurality of first substrates 111 through a second connection line 1182. The third connection pad 1193 refers to a pad to which the COF 130 is bonded and may be used for transferring a signal from the COF 130 to a sub-pixel.

The passivation layer 1194 is disposed on the second interlayer insulating layer 1114b. The passivation layer 1194 may be disposed on the plurality of first substrates 111 so as to cover a part of upper surfaces and side surfaces of the source electrode 1153, the drain electrode 1154 and the second interlayer insulating layer 1114b. The passivation layer 1194 may serve as a protective layer for protecting the transistor 1150 against permeation of moisture, oxygen, and the like. The passivation layer 1194 may be formed of an inorganic material and formed as one or more layers, but is not limited thereto.

An overcoating layer 1115 is disposed on the passivation layer 1194. The overcoating layer 1115 may be disposed to cover upper surfaces and side surface of the plurality of inorganic insulating layers disposed on the plurality of first substrates 111 and the plurality of second substrates 121. Specifically, the overcoating layer 1115 may be disposed to cover an upper surface and a side surface of the passivation layer 1194, a side surface of the interlayer insulating layer 1114 and a part of a side surface of the buffer layer 1112.

The second connection line 1182 is disposed on the overcoating layer 1115. The second connection line 1182 may be disposed to cover a side surface and a part of an upper surface of the overcoating layer 1115 and upper surfaces of the plurality of connection supports 120.

The second connection line 1182 may be electrically connected to the source electrode 1153 or the drain electrode 1154 and the third connection pad 1193 through a contact hole formed in the passivation layer 1194 and the overcoating layer 1115. In this case, the second connection line 1182 may electrically connect the source electrode 1153 or the drain electrode 1154 disposed on the plurality of first substrates 111 and the third connection pad 1193 disposed on the plurality of second substrates 121.

Meanwhile, in some example embodiments, the first part P1 and the second part P2 of the buffer layer 1112 may have the same width. That is, the second width W2 of the second part P2 of the buffer layer 1112 is the same as the first width W1 of the first part P1, and, thus, the width of the buffer layer 1112 can be defined as the first width W1. In this case, the active buffer 1119 may include a first part P1 and a second part P2 on the first part P1. Also, the first part P1 of the active buffer 1119 may have a first width W1 and the second part P2 of the active buffer 1119 may have a second width W2 which is smaller than the first width W1 of the first part P1. Otherwise, the active buffer 1119 may have the first width W1 which is the same as the first width W1 of the buffer layer 1112. Also, the gate insulating layer 1113 may include a first part P1 and a second part P2 on the first part P1. Further, the first part P1 of the gate insulating layer 1113 may have a first width W1 and the second part P2 of the gate insulating layer 1113 may have a second width W2 which is smaller than the first width W1 of the first part P1.

Further, in some example embodiments, the first part P1 and the second part P2 of the buffer layer 1112 may have the same width. That is, the second width W2 of the second part P2 of the buffer layer 1112 is the same as the first width W1 of the first part P1, and, thus, the width of the buffer layer 1112 can be defined as the first width W1. In this case, the active buffer 1119 and the gate insulating layer 1113 may be formed to have the second width W2 which is smaller than the first width W1. Thus, the buffer layer 1112, the active buffer 1119 and the gate insulating layer 1113 may form a stepped structure.

FIG. 12A through FIG. 12M are process diagrams provided to explain a manufacturing process of the stretchable display device illustrated in FIG. 11.

Figure 12A:
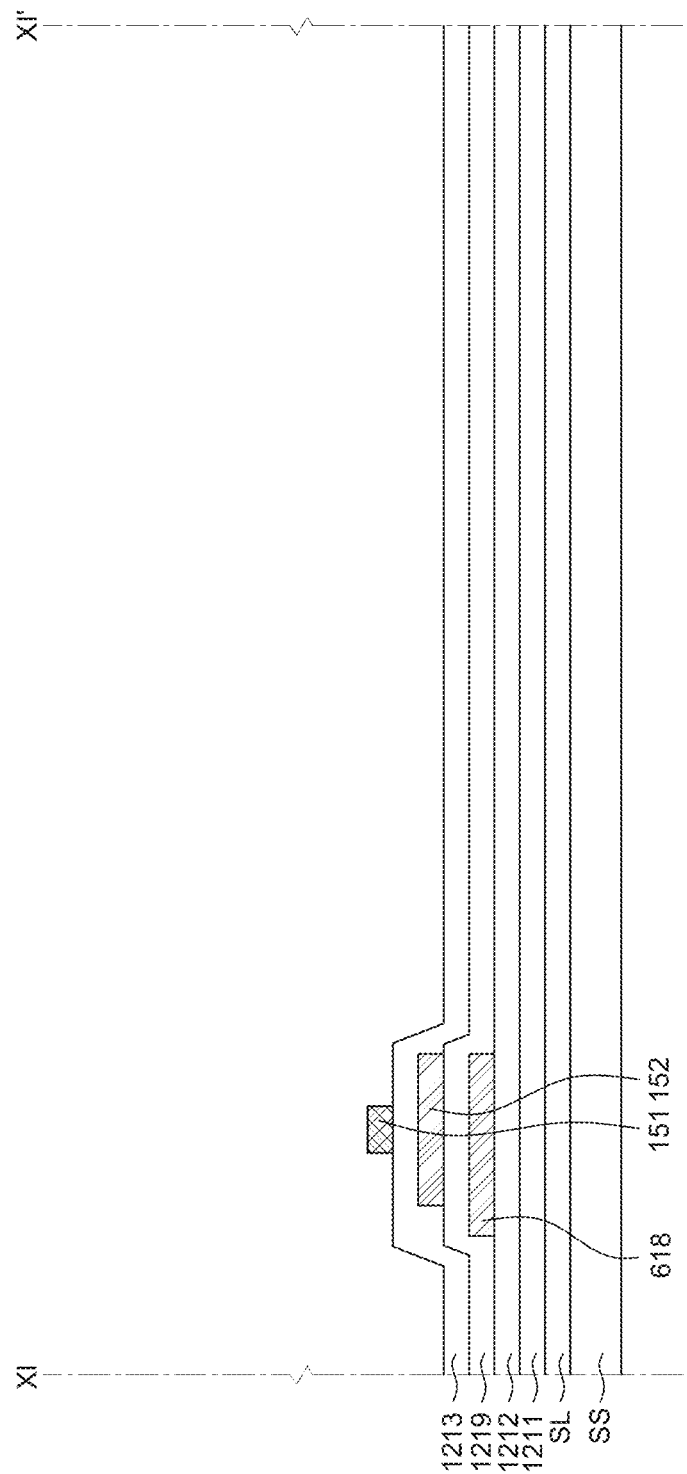
FIG. 12A through FIG. 12M are process diagrams provided to explain a manufacturing process of the stretchable display device illustrated in FIG. 11.

Referring to FIG. 12A, a sacrificial layer SL and a temporary substrate 1211 are disposed on a subsidiary substrate SS. The subsidiary substrate SS is configured to support the temporary substrate 1211 during the manufacturing process of the stretchable display device 1100. The subsidiary substrate SS may be a glass substrate, but is not limited thereto.

The sacrificial layer SL is disposed on the subsidiary substrate SS. The sacrificial layer SL is used to separate the subsidiary substrate SS from the temporary substrate 1211. If a laser is irradiated to the sacrificial layer SL, the adhesion strength between the subsidiary substrate SS and the temporary substrate 1211 may decrease. By irradiating a laser to the sacrificial layer SL, the subsidiary substrate SS may be removed from the temporary substrate 1211. The sacrificial layer SL may be formed of amorphous silicon (a-Si) or silicon nitride (SiNx), but is not limited thereto.

Then, the temporary substrate 1211 is disposed on the sacrificial layer SL. In the temporary substrate 1211, a stiff area SA and an elastic area EA may be defined. Specifically, the temporary substrate 1211 may be removed in part in a follow-up process and may become the plurality of first substrates 111, the plurality of connection supports 120 or the plurality of second substrates 121. For example, the stiff area SA of the temporary substrate 1211 may become the plurality of first substrates 111 or the plurality of second substrates 121, and the elastic area EA of the temporary substrate 1211 may become the plurality of connection supports 120. Thus, the temporary substrate 1211 may be formed of a plastic material having flexibility, such as polyimide (PI), polyacrylate, and polyacetate, but is not limited thereto.

Then, a buffer layer material 1212 is formed on the temporary substrate 1211. Specifically, the buffer layer material 1212 may be formed in the stiff area SA and the elastic area EA of the temporary substrate 1211. The buffer layer material 1212 may be referred to as a first inorganic insulating material. For example, the buffer layer material 1212 may be an inorganic insulating material formed of silicon nitride (SiNx), silicon oxide (SiOx), silicon oxynitride (SiON), or the like.

Then, the BSM 618 is formed on the buffer layer material 1212, and an active buffer material 1219 is formed on the buffer layer material 1212 and the BSM 618. The active buffer material 1219 may be referred to as a second inorganic insulating material. Specifically, the active buffer material 1219 may be formed in the stiff area SA and the elastic area EA of the temporary substrate 1211. The active buffer material 1219 may be an inorganic insulating material formed of silicon nitride (SiNx) or silicon oxide (SiOx).

Then, the active layer 152 is formed on the active buffer material 1219, and a gate insulating layer material 1213 is formed on the active buffer material 1219 and the active layer. The gate insulating layer material 1213 may be referred to as a second inorganic insulating material. The gate insulating layer material 1213 may be an inorganic insulating material formed of silicon nitride (SiNx) or silicon oxide (SiOx).

Then, the gate electrode 151 is formed on the gate insulating layer material 1213.

Figure 12B:
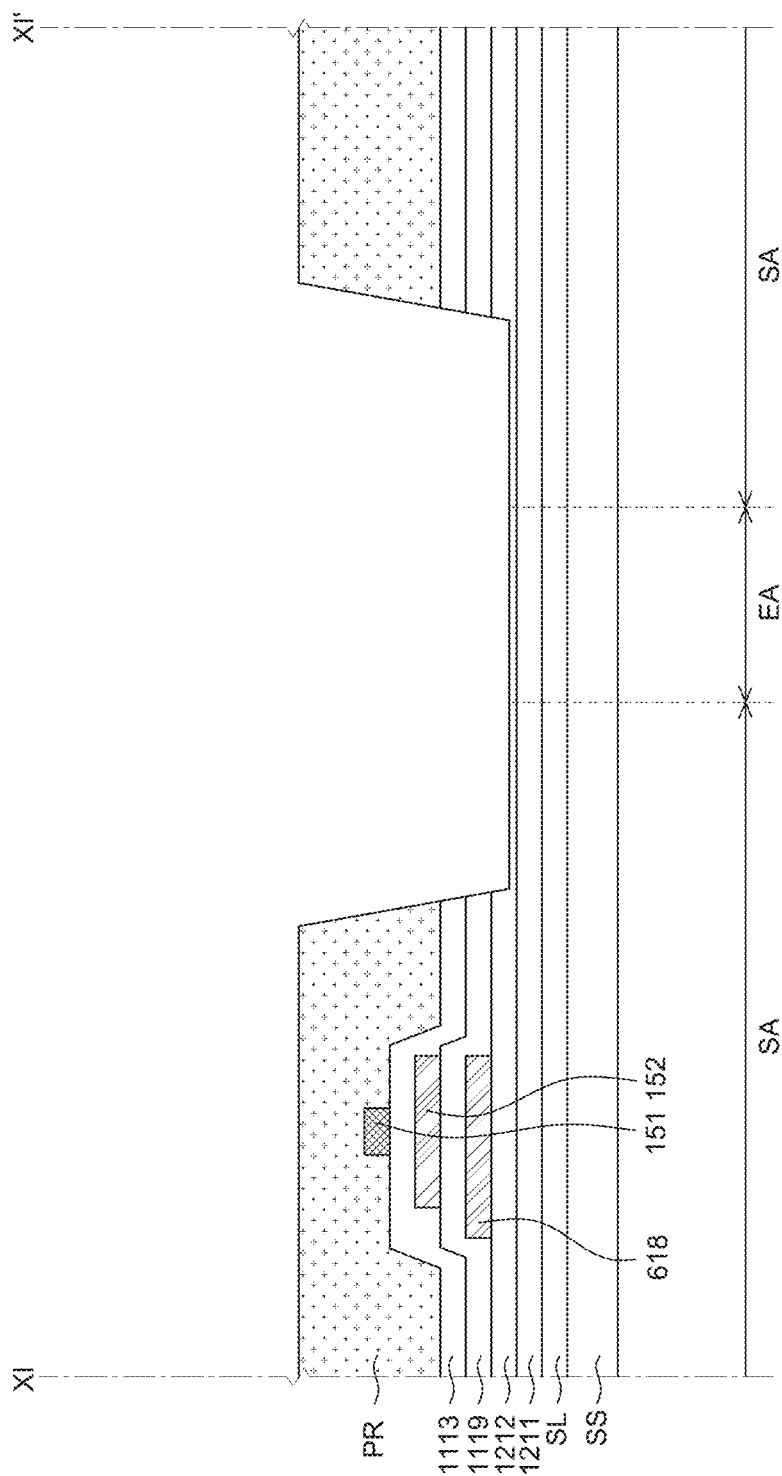

Then, referring to FIG. 12B, a second inorganic insulating layer is formed by selectively removing a portions of the second inorganic insulating material disposed in the elastic area EA and a part of the stiff area SA adjacent to the elastic area EA. Specifically, the active buffer 1119 and the gate insulating layer 1113 may be formed by removing the active buffer material 1219 and the gate insulating layer material 1213 disposed in the elastic area EA and a part of the stiff area SA adjacent to the elastic area EA. For example, a photoresist PR is formed on the active buffer material 1219 and the gate insulating layer material 1213 disposed on the other part of the stiff area SA. Then, the active buffer material 1219 and the gate insulating layer material 1213 disposed in the elastic area EA and a part of the stiff area SA adjacent to the elastic area EA are removed to form the active buffer 1119 and the gate insulating layer 1113. Thus, only the buffer layer material 1212 may remain in the elastic area EA and a part of the stiff area SA adjacent to the elastic area EA.

Meanwhile, the process of forming the second inorganic insulating layer may include a process of removing a part of a first inorganic insulating material disposed in the elastic area EA except a part overlapping the active buffer 1119 and the gate insulating layer 1113 and a part of the stiff area SA adjacent to the elastic area EA. For example, in the process of forming the second inorganic insulating layer, a part of the buffer layer material 1212 disposed in the elastic area EA and a part of the stiff area SA adjacent to the elastic area EA may be removed. Thus, only a part of the buffer layer material 1212 having a smaller thickness than the buffer layer material 1212 disposed in the stiff area SA may remain in the elastic area EA and a part of the stiff area SA adjacent to the elastic area EA.

Figure 12C:
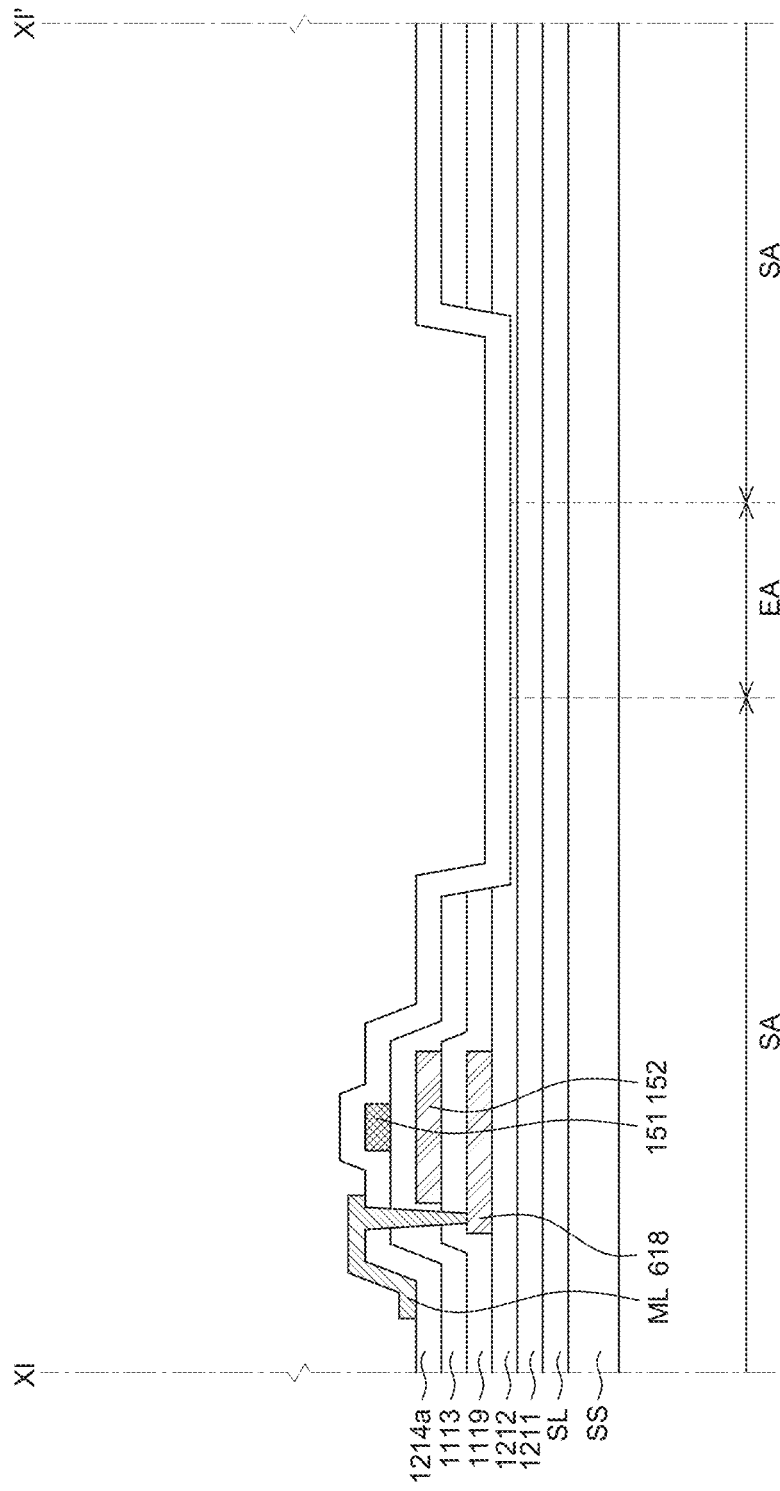
Figure 12D:
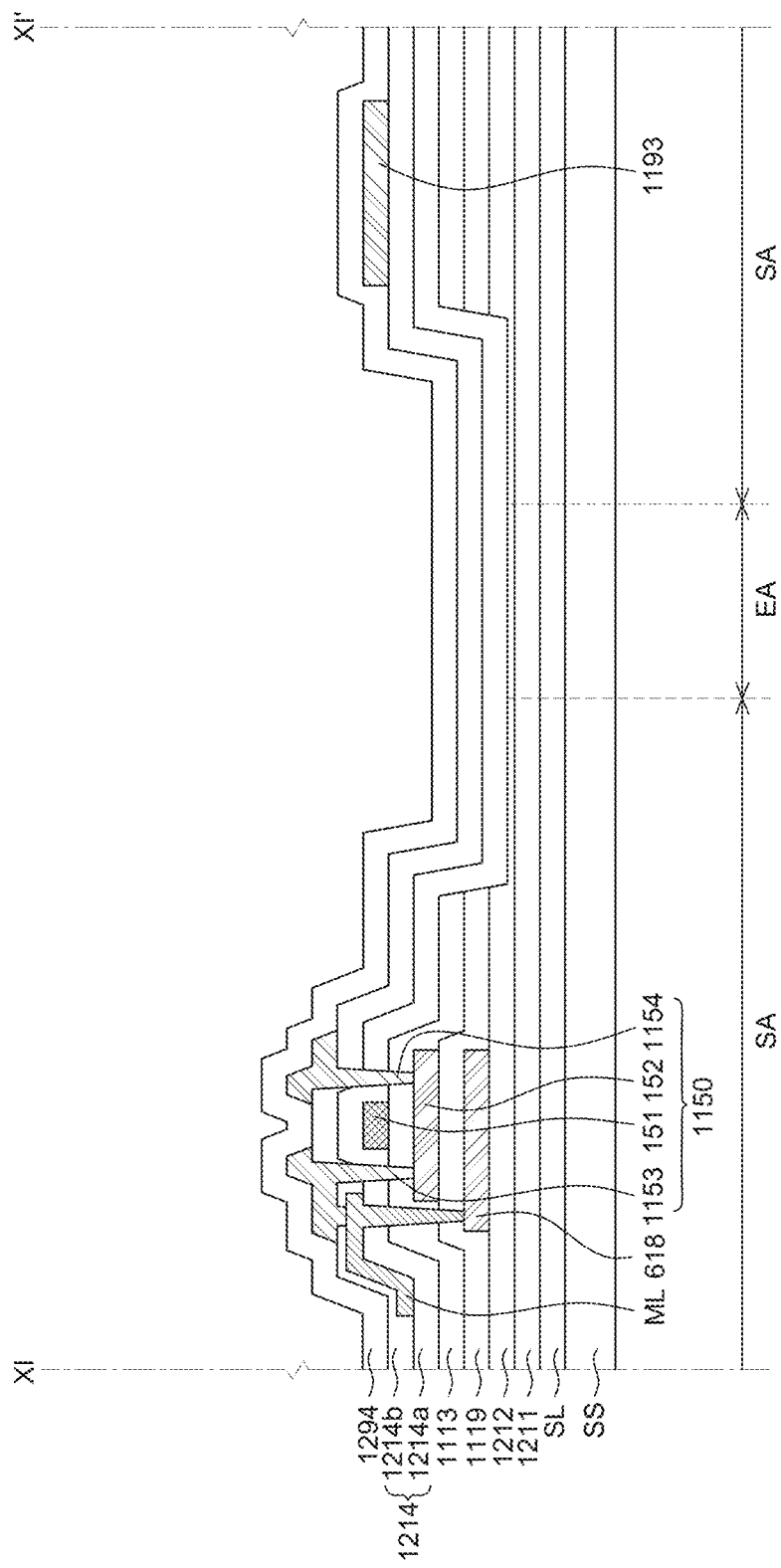

Then, referring to FIG. 12C and FIG. 12D, a third inorganic insulating material is formed on the first inorganic insulating material and the second inorganic insulating layer. The third inorganic insulating material may include a first interlayer insulating layer material 1214a, a second interlayer insulating layer material 1214b and a passivation layer material 1294.

Referring to FIG. 12C, the first interlayer insulating layer material 1214a is formed on the buffer layer material 1212, the active buffer 1119 and the gate insulating layer 1113. The first interlayer insulating layer material 1214a may be formed of an inorganic insulating material such as silicon nitride (SiNx) or silicon oxide (SiOx).

Then, the middle line ML is formed on the first interlayer insulating layer material 1214a. The middle line ML may be connected to the BSM 618 through a contact hole formed in the first interlayer insulating layer material 1214a, the gate insulating layer 1113 and the active buffer 1119.

Then, referring to FIG. 12D, the second interlayer insulating layer material 1214b is formed on the first interlayer insulating layer material 1214a and the middle line ML. The second interlayer insulating layer material 1214b may be identical to the first interlayer insulating layer material 1214a, but is not limited thereto.

Then, the source electrode 1153, the drain electrode 1154 and the third connection pad 1193 are formed on the second interlayer insulating layer material 1214b. Also, the passivation layer material 1294 is formed on the second interlayer insulating layer material 1214b, the source electrode 1153, the drain electrode 1154 and the third connection pad 1193. The passivation layer material 1294 may be formed of an inorganic material that suppresses the permeation of moisture and oxygen into the stretchable display device 1100.

Figure 12E:
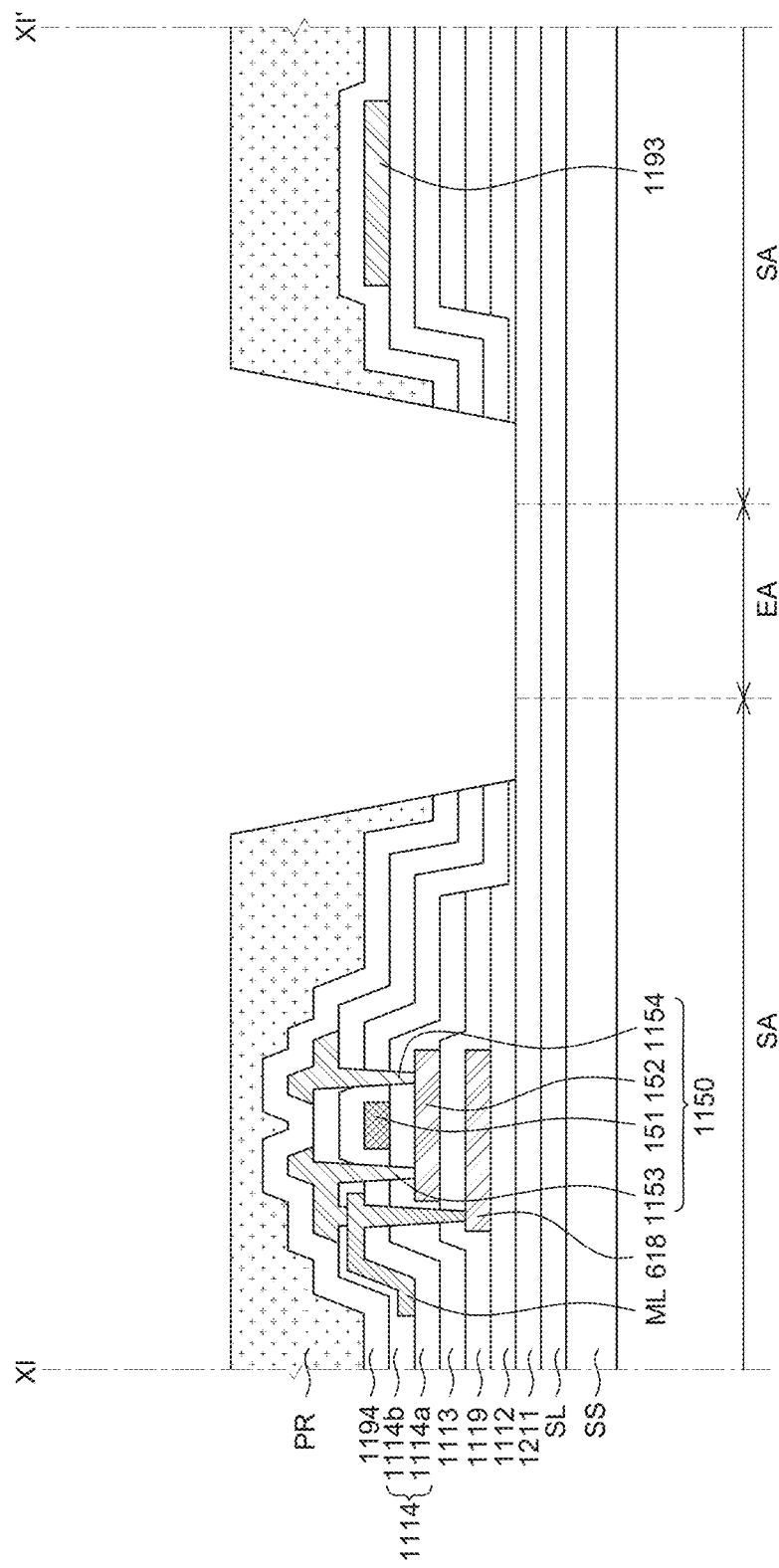

Then, referring to FIG. 12E, a first inorganic insulating layer and a third inorganic insulating layer may be formed by removing the first inorganic insulating material and third inorganic insulating material disposed in the elastic area EA and the stiff area SA adjacent to the elastic area EA. Specifically, the buffer layer material 1212, the first interlayer insulating layer material 1214a, the second interlayer insulating layer material 1214b and the passivation layer material 1294 disposed in the elastic area EA and the stiff area SA adjacent to the elastic area EA may be removed. Thus, the buffer layer 1112, the first interlayer insulating layer 1114a, the second interlayer insulating layer 1114b and the passivation layer 1194 may be formed. For example, the photoresist PR may be coated on the buffer layer material 1212, the first interlayer insulating layer material 1214a, the second interlayer insulating layer material 1214b and the passivation layer material 1294 disposed in a part of the stiff area SA. Then, the buffer layer material 1212, the first interlayer insulating layer material 1214a, the second interlayer insulating layer material 1214b and the passivation layer material 1294 disposed in the elastic area EA and the stiff area SA adjacent to the elastic area EA may be removed. Thus, the buffer layer 1112, the first interlayer insulating layer 1114a, the second interlayer insulating layer 1114b and the passivation layer 1194 may be formed. Therefore, a plurality of inorganic insulating layers may not be disposed in the elastic area EA and the stiff area SA adjacent to the elastic area EA. Also, an upper surface of the temporary substrate 1211 in the elastic area EA and the stiff area SA adjacent to the elastic area EA may be exposed.

Figure 12F:
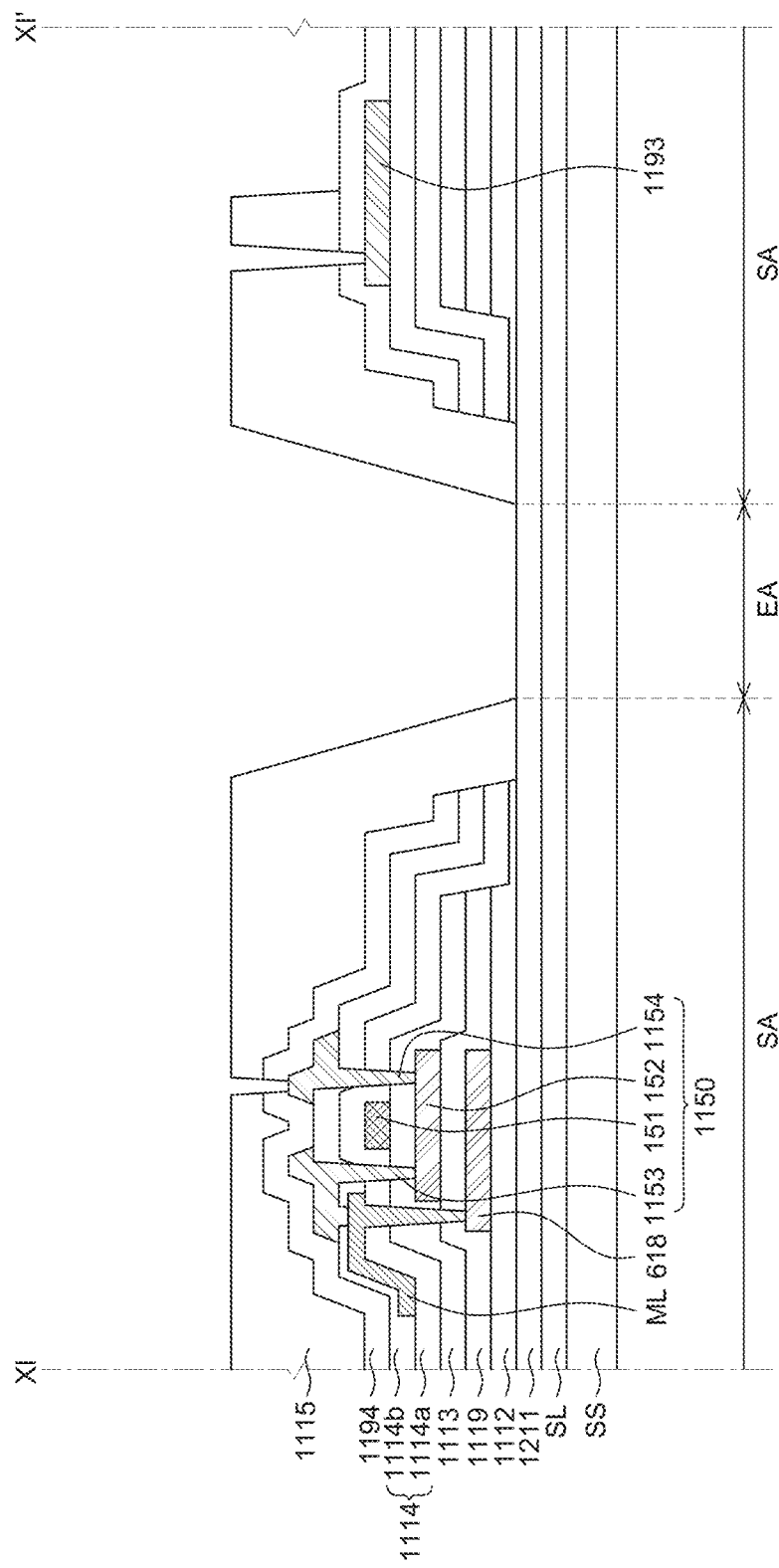

Then, referring to FIG. 12F, the overcoating layer 1115 is formed on the passivation layer 1194. The overcoating layer 1115 may be referred to as an organic insulating layer. The overcoating layer 1115 may be formed by forming and then patterning an overcoating layer material on the passivation layer 1194. Thus, the overcoating layer 1115 may be patterned to expose a part of the drain electrode 1154, the upper surface of the temporary substrate 1211 and a part of the third connection pad 1193.

Figure 12G:
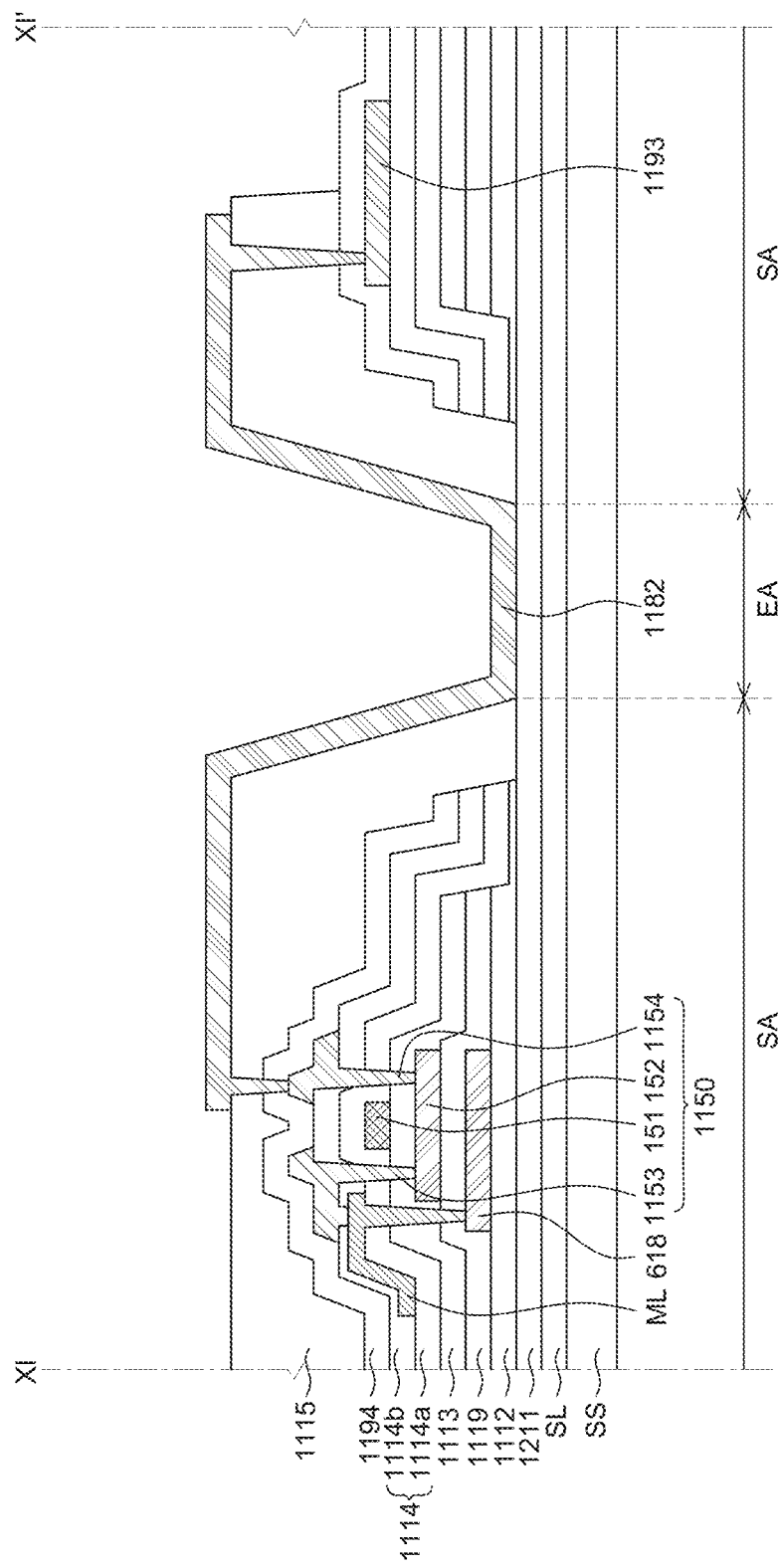

Then, referring to FIG. 12G, the second connection line 1182 is formed on the overcoating layer 1115 and the temporary substrate 1211. The second connection line 1182 may connect stiff areas SA adjacent to each other among a plurality of stiff areas SA on the temporary substrate 1211. For example, as illustrated in FIG. 12G, the second connection line 1182 may electrically connect the drain electrode 1154 disposed in a stiff area SA and the third connection pad 1193 disposed in another stiff area SA among the plurality of stiff areas SA.

Figure 12H:
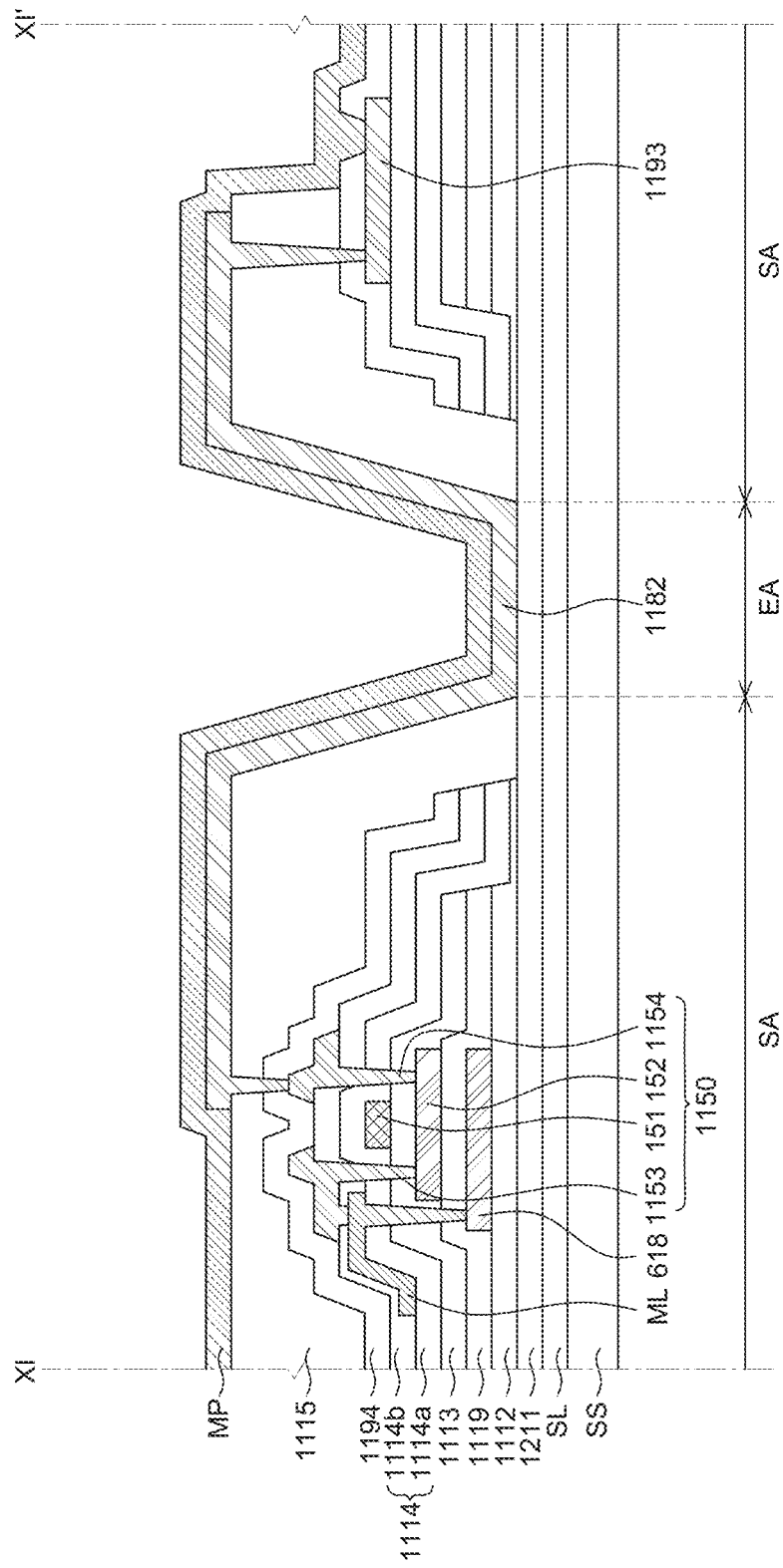
Figure 12I:
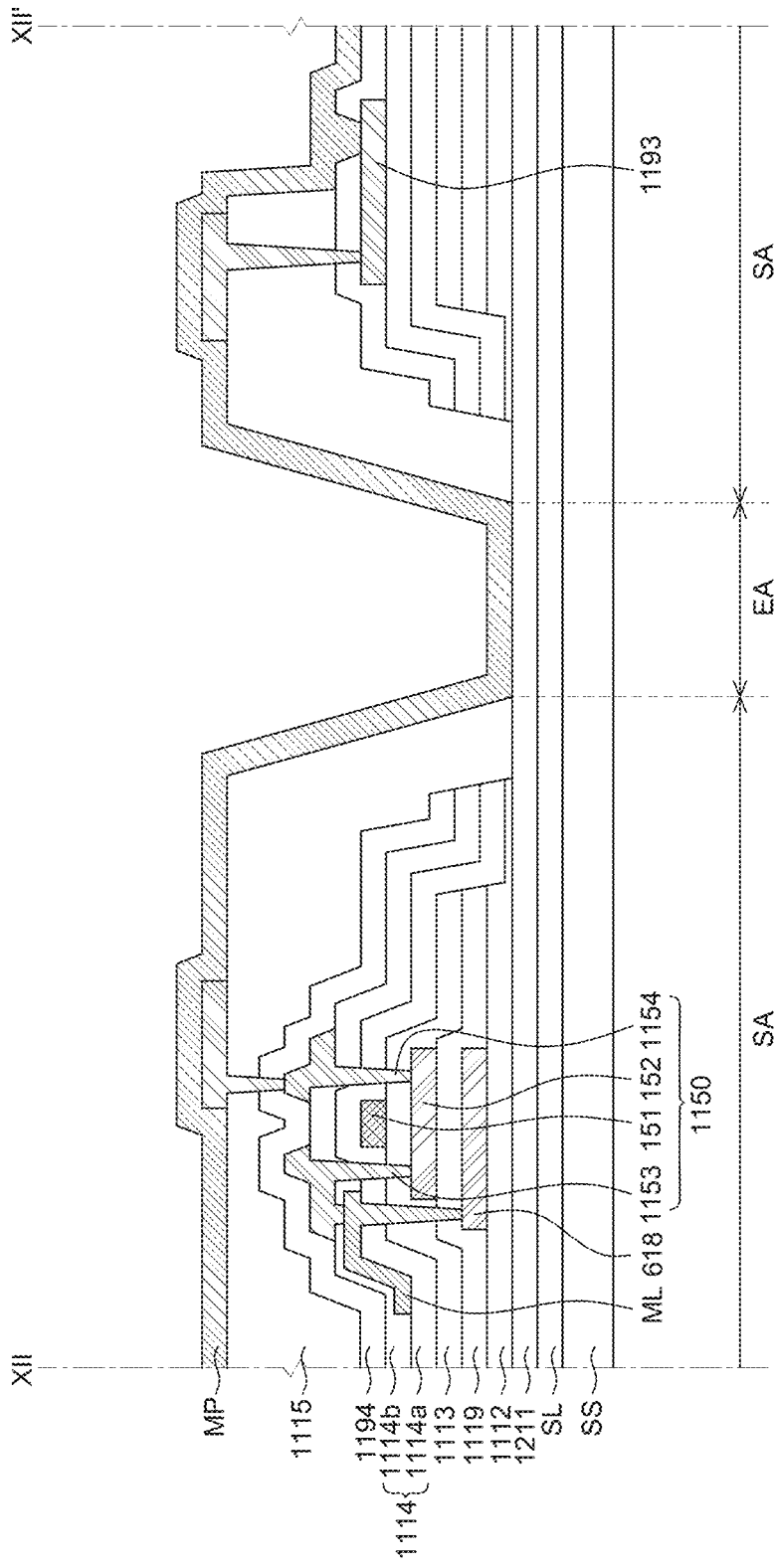

Referring to FIG. 12H and FIG. 12I, a mask pattern MP is formed on the overcoating layer 1115 and the second connection line 1182. The mask pattern MP may be used for removing the temporary substrate 1211 in an area that does not overlap an organic insulating layer and a plurality of connection lines. Specifically, the mask pattern MP may be formed on the overcoating layer 1115 and the second connection line 1182. Then, the temporary substrate 1211 may be removed from a part of the elastic area EA where the second connection line 1182 is not disposed to form the plurality of first substrates 111 and the plurality of connection supports 120. Therefore, the mask pattern MP may be formed of a material having a lower etching rate in an etchant than the temporary substrate 1211. For example, if the temporary substrate 1211 is etched using the photoresist PR, the photoresist PR may be etched earlier than the temporary substrate 1211. Thus, the mask pattern MP may be formed of a transparent conductive oxide such as ITO, IZO, ITZO, ZnO, and TO, but is not limited thereto.

Figure 12J:
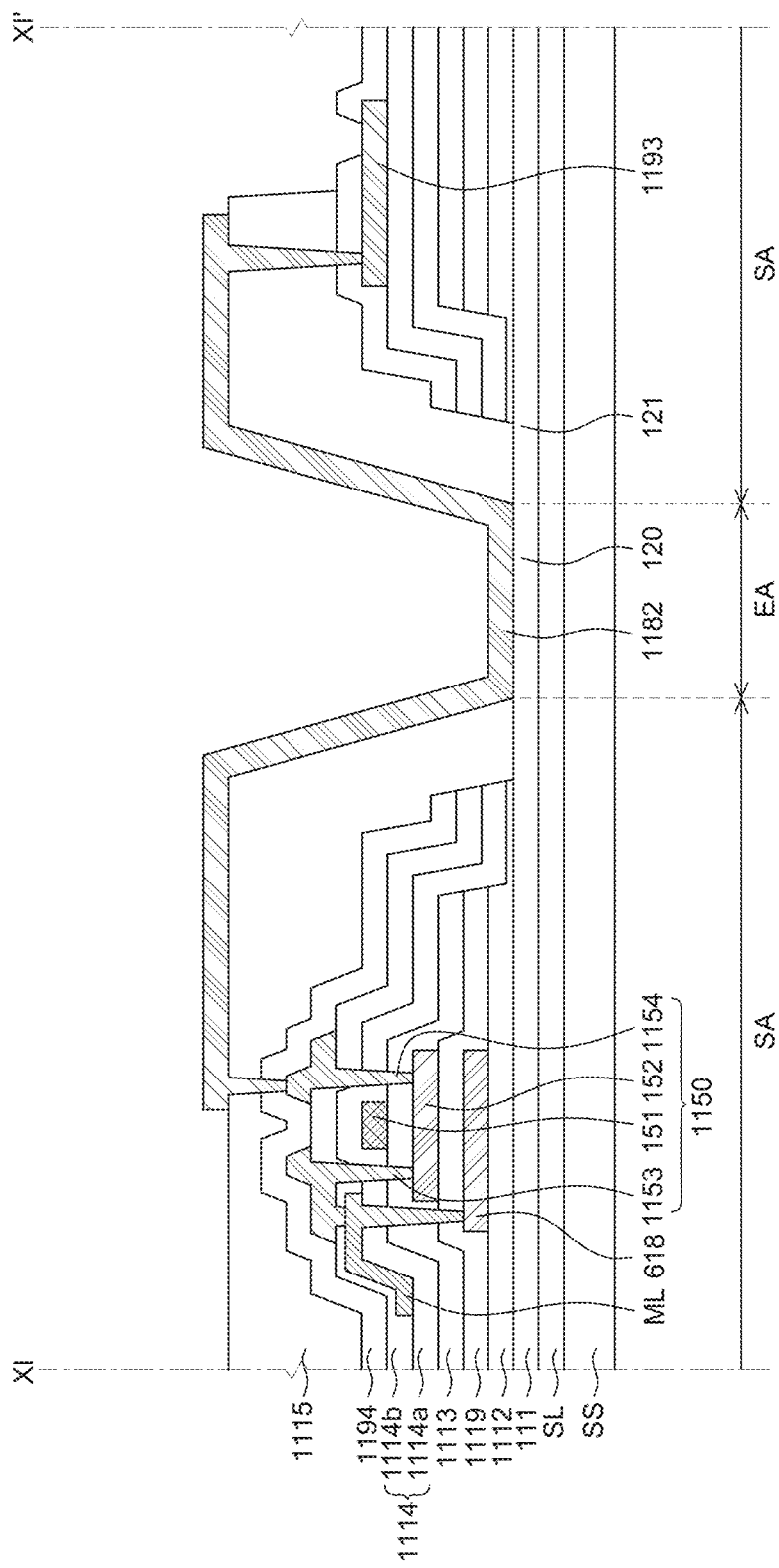
Figure 12K:
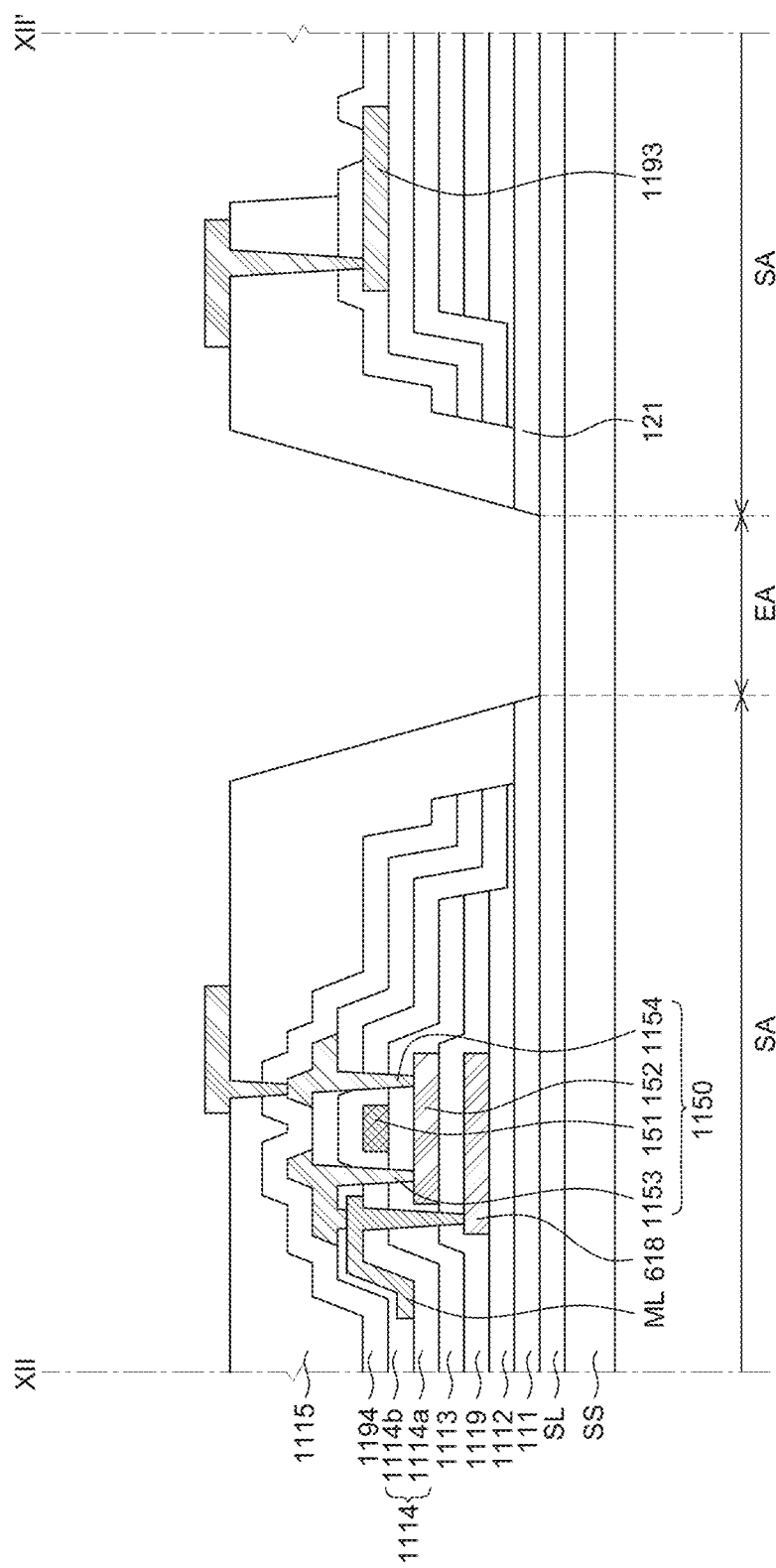

Referring to FIG. 12J and FIG. 12K, after the plurality of first substrates 111 and the plurality of connection supports 120 are formed, the mask pattern MP formed on the overcoating layer 1115 and the second connection line 1182 is removed.

Figure 12L:
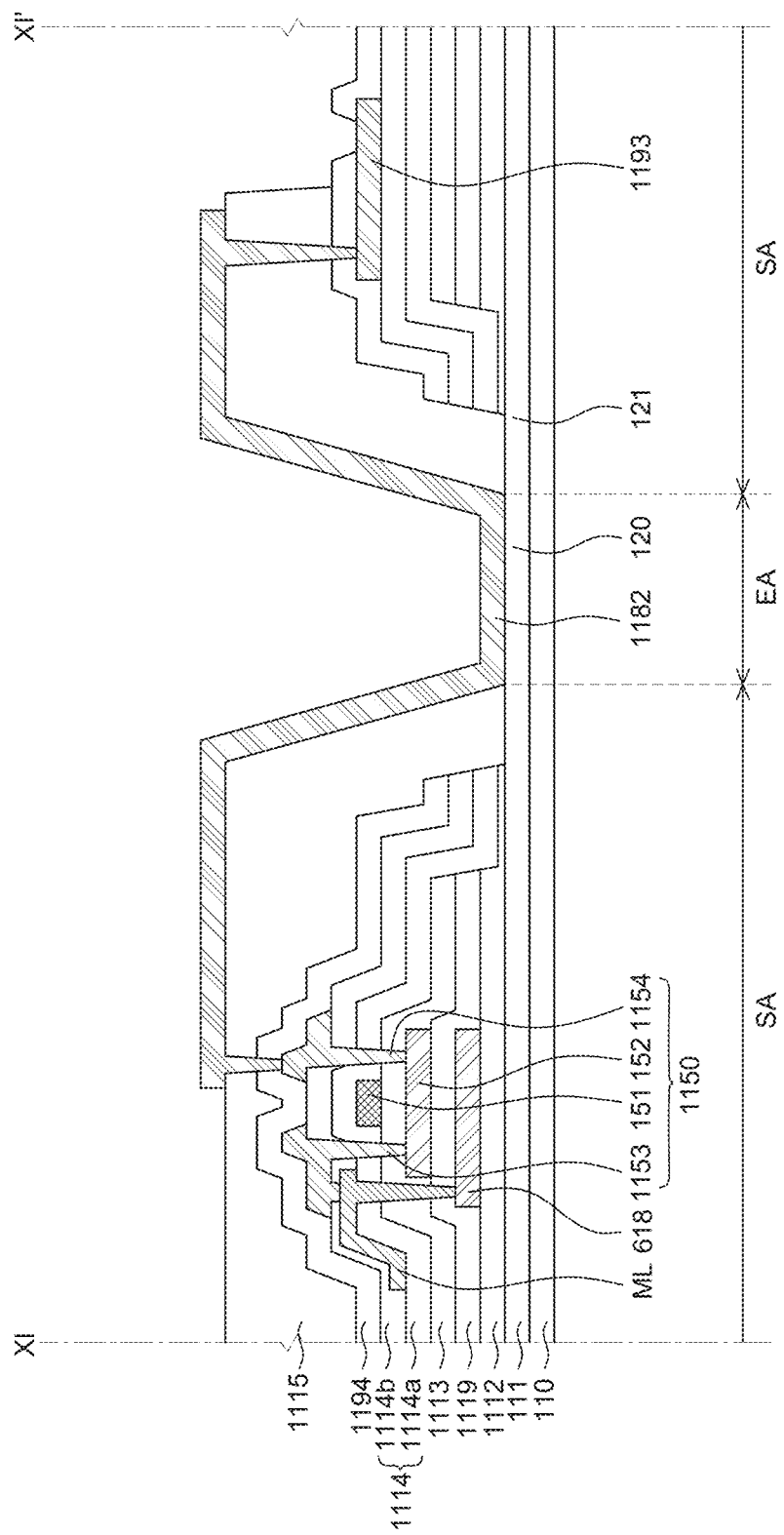
Figure 12M:
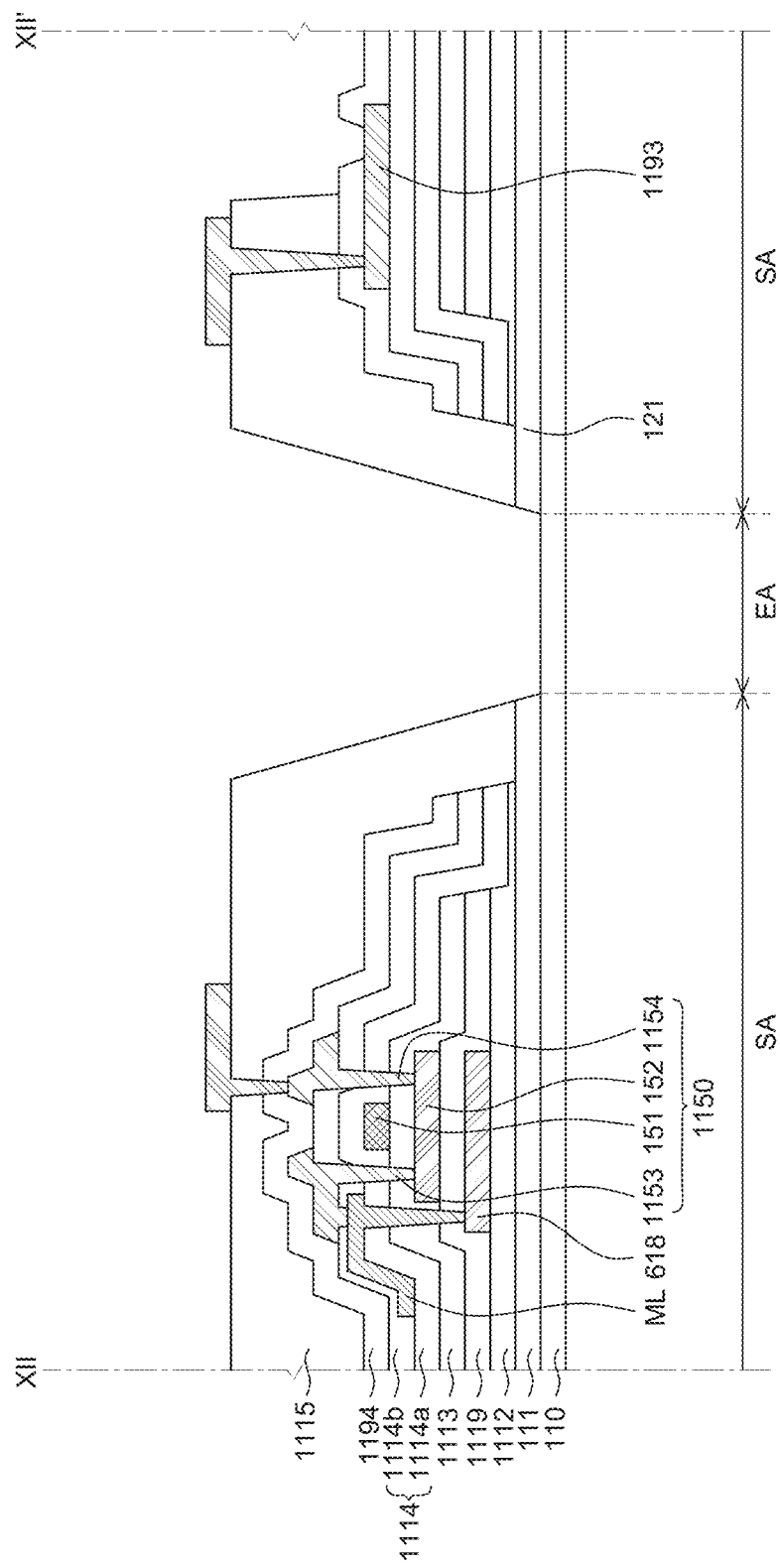

Referring to FIG. 12L and FIG. 12M, after the subsidiary substrate SS and the sacrificial layer SL disposed under the plurality of first substrates 111 and the plurality of connection supports 120 are removed, the lower substrate 110 is disposed. The lower substrate 110 may be disposed under the plurality of first substrates 111 and the plurality of connection supports 120 to support and protect various components disposed on the plurality of first substrates 111 and the plurality of connection supports 120.

In a method of manufacturing the stretchable display device 1100 according to still another example embodiment of the present disclosure, an inorganic insulating material on the temporary substrate 1211 is removed through a plurality of processes rather than a single process. That is, as described above, in the method of manufacturing the stretchable display device 1100 according to still another example embodiment of the present disclosure, a patterning process of the buffer layer material 1212, the active buffer material 1219 and the gate insulating layer material 1213 is performed first. Thus, the buffer layer 1112, the active buffer 1119 and the gate insulating layer 1113 are formed first. Then, a patterning process of the first interlayer insulating layer material 1214a, the second interlayer insulating layer material 1214b and the passivation layer material 1294 is performed. Thus, the first interlayer insulating layer 1114a, the second interlayer insulating layer 1114b and the passivation layer 1194 are formed. In the method of manufacturing the stretchable display device 1100 according to still another example embodiment of the present disclosure, the buffer layer material 1212, the active buffer material 1219, the gate insulating layer material 1213, the first interlayer insulating layer material 1214a, the second interlayer insulating layer material 1214b and the passivation layer material 1294 disposed in the elastic area EA need to be removed. However, the elastic area EA is greater in size than the stiff area SA, and it is difficult in terms of uniformity to remove all the inorganic materials disposed in the wide area through a single process. Therefore, in the method of manufacturing the stretchable display device 1100 according to still another example embodiment of the present disclosure, the patterning process of the buffer layer material 1212, the active buffer material 1219 and the gate insulating layer material 1213 is performed first. Then, the patterning process of the first interlayer insulating layer material 1214a, the second interlayer insulating layer material 1214b and the passivation layer material 1294 is performed. Thus, uniformity in the patterning process of the inorganic materials can be secured.

Also, in the method of manufacturing the stretchable display device 1100 according to still another example embodiment of the present disclosure, when the second inorganic insulating layer is patterned and formed, a part of the first inorganic insulating material is left on the elastic area EA and the stiff area SA adjacent to the elastic area EA. Thus, when an inorganic material or metal material is formed in a follow-up process, it is possible to suppress peeling of the inorganic material or metal material from the temporary substrate 1211. For example, if all the first inorganic insulating material on the elastic area EA and the stiff area SA adjacent to the elastic area EA is removed when the second inorganic insulating layer is formed, an inorganic material or metal material may be formed on the temporary substrate 1211 in a follow-up process. However, the temporary substrate 1211 formed of the first inorganic insulating material and the organic material has different surface energies. Therefore, when the inorganic material or metal material is formed on the temporary substrate 1211, the inorganic material or metal material may peel off from the temporary substrate 1211. Accordingly, when the second inorganic insulating layer is patterned and formed, a part of the first inorganic insulating material is left on the elastic area EA and the stiff area SA adjacent to the elastic area EA. Thus, an inorganic material or metal material is deposited on the first inorganic insulating material in a follow-up process. Therefore, it is possible to suppress peeling of the inorganic material or metal material.

Further, in the method of manufacturing the stretchable display device 1100 according to still another example embodiment of the present disclosure, when the second inorganic insulating layer is patterned and formed, a part of the first inorganic insulating material is left on the elastic area EA and the stiff area SA adjacent to the elastic area EA. Thus, it is possible to suppress the formation of an undercut portion in the temporary substrate 1211. For example, all the first inorganic insulating material on the elastic area EA and the stiff area SA adjacent to the elastic area EA is removed when the second inorganic insulating layer is formed, a part of the stiff area SA adjacent to a photoresist PR-coated portion of the temporary substrate 1211 is also etched. Therefore, an undercut portion may be formed in the temporary substrate 1211. However, if an undercut portion is formed in a part of the temporary substrate 1211, an inorganic material or metal material deposited in a follow-up process may be cut off from each other by the undercut portion. Accordingly, when a patterning process is performed, a part of the first inorganic insulating material is left on the elastic area EA and the stiff area SA adjacent to the elastic area EA. Thus, it is possible to suppress the formation of an undercut portion in the temporary substrate 1211. Also, an inorganic material or metal material can be deposited in a follow-up process without being cut off from each other.

Figure 13:
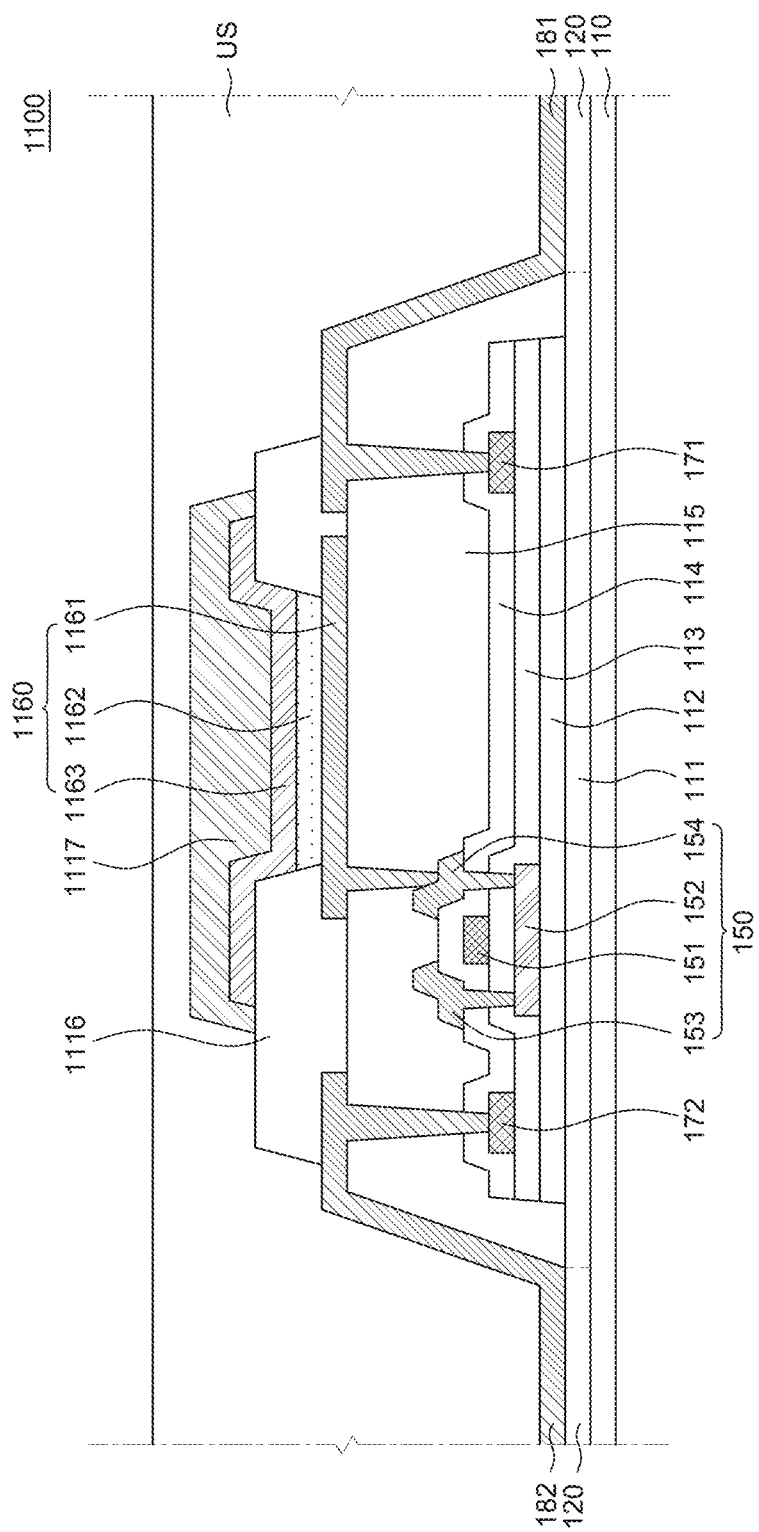
FIG. 13 is a schematic cross-sectional view illustrating a sub-pixel of a stretchable display device according to still another example embodiment of the present disclosure.

FIG. 13 is a schematic cross-sectional view illustrating a sub-pixel of a stretchable display device according to still another example embodiment of the present disclosure. A stretchable display device 1300 shown in FIG. 13 is substantially the same as the stretchable display device 100 shown in FIG. 1 through FIG. 3 except an organic light-emitting diode (OLED) 1360 and a bank 1316. Therefore, redundant description of the same components will not be provided.

Referring to FIG. 13, the OLED 1360 is disposed corresponding to each of the plurality of sub-pixels SPX and emits light in a specific wavelength range. That is, the OLED 1360 may be a blue OLED that emits blue light, a red OLED that emits red light, a green OLED that emits green light, or a white OLED that emits white light, but is not limited thereto. If the OLED 1360 is a white OLED, the stretchable display device 1300 may further include a color filter.

The OLED 1360 includes an anode 1361, an organic emission layer 1362, and a cathode 1363. Specifically, the anode 1361 is disposed on the overcoating layer 115. The anode 1361 is an electrode configured to supply holes into the organic emission layer 1362. The anode 1361 may be formed of a transparent conductive material having high work function. Herein, the transparent conductive material may include indium tin oxide (ITO), indium zinc oxide (IZO), and indium tin zinc oxide (ITZO). Further, if the stretchable display device 1300 is of top-emission type, the anode 1361 may further include a reflective plate.

The anode 1361 is disposed as separated for each sub-pixel SPX and electrically connected to the transistor 150 through the contact hole formed in the overcoating layer 115. For example, FIG. 13 illustrates that the anode 1361 is electrically connected to the drain electrode 154 of the transistor 150, but the anode 1361 may be electrically connected to the source electrode 153.

The bank 1316 is formed on the anode 1361, the connection lines 180, and the overcoating layer 115. The bank 1316 separates adjacent sub-pixels SPX from each other. The bank 1316 is disposed to cover at least a part of both sides of the adjacent anode 1361 and exposes a part of an upper surface of the anode 1361. The bank 1316 may serve to suppress light emission of unintended sub-pixels SPX or color mixing which occurs when light is emitted from the sides of the anode 1361 due to concentration of current on the edges of the anode 1361. The bank 1316 may be formed of acryl-based resin, benzocyclobutene (BCB)-based resin, or PI, but is not limited thereto.

The bank 1316 includes a contact hole for connecting the connection line 180 serving as a data line and the data pad 172 and a contact hole for connecting the connection line 180 serving as a gate line and the gate pad 171.

The organic emission layer 1362 is disposed on the anode 1361. The organic emission layer 1362 is configured to emit light. The organic emission layer 1362 may contain a light-emitting material, and the light-emitting material may include a phosphorescent material or a fluorescent material, but is not limited thereto.

The organic emission layer 1362 may be formed as a single emission layer. Otherwise, the organic emission layer 1362 may have a stack structure in which a plurality of emission layers with a charge generation layer interposed therebetween is laminated. Further, the organic emission layer 1362 may further include at least one organic layer of a hole transport layer, an electron transport layer, a hole block layer, an electron block layer, a hole injection layer, and an electron injection layer.

Referring to FIG. 13, the cathode 1363 is disposed on the organic emission layer 1362. The cathode 1363 is configured to supply electrons into the organic emission layer 1362. The cathode 1363 may be formed of a transparent conductive oxide such as ITO, IZO, ITZO, zinc oxide (ZnO), and tin oxide (TO) or an ytterbium (Yb) alloy. Otherwise, the cathode 1363 may be formed of a metal material.

The cathode 1363 may be patterned to overlap each of the plurality of first substrates 111. That is, the cathode 1363 may be formed only in a region overlapping the plurality of first substrates 111 and may not be formed a region between the plurality of first substrates 111. The cathode 1363 is formed of a transparent conductive oxide, a metal material, and the like. Thus, if the cathode 1363 is formed between the plurality of first substrates 111, the cathode 1363 may be damaged while the stretchable display device 1300 is stretched. Thus, the cathode 1363 may be formed on the plane so as to correspond to each of the plurality of first substrates 111. Referring to FIG. 13, the cathode 1363 may be formed in the region overlapping the plurality of first substrates 111 so as not to overlap the region which is disposed the connection lines 180.

Unlike the general organic light-emitting display device, the stretchable display device 1300 according to still another embodiment of the present disclosure includes the cathodes 1363 patterned corresponding to the plurality of first substrates 111. Therefore, the cathodes 1363 respectively disposed on the plurality of first substrates 111 can be independently supplied with low-potential power through the connection lines 180.

Referring to FIG. 13, an encapsulation layer 1317 is disposed on the OLED 1360. The encapsulation layer 1317 covers the OLED 1360 to be in contact with a part of an upper surface of the bank 1316 and thus seals the OLED 1360. Thus, the encapsulation layer 1317 protects the OLED 1360 against permeation of moisture or air from the outside or physical impacts.

The encapsulation layer 1317 covers the cathodes 1363 patterned to overlap the plurality of first substrates 111, respectively, and may be formed for each of the plurality of first substrates 111. That is, the encapsulation layer 1317 may be disposed to cover a single cathode 1363 disposed on a single first substrate 111, and the encapsulation layers 1317 disposed on the respective first substrates 111 may be spaced apart from each other.

The encapsulation layer 1317 may be formed only in the region overlapping the plurality of first substrates 111. As described above, the encapsulation layer 1317 may be configured including an inorganic layer. Therefore, the encapsulation layer 1317 may be easily damaged, such as cracked, while the stretchable display device 1300 is stretched. Particularly, since the OLED 1360 is vulnerable to moisture or oxygen, if the encapsulation layer 1317 is damaged, the reliability of the OLED 1360 may be degraded. Therefore, in the stretchable display device 1300 according to still another embodiment of the present disclosure, the encapsulation layer 1317 is not formed in the region between the plurality of first substrates 111. Thus, even when the stretchable display device 1300 is deformed by bending or stretching, it is possible to minimize damage to the encapsulation layer 1317.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
a lower substrate having an active area and a non-active area adjacent to the active area, the lower substrate having a first modulus of elasticity;
a plurality of individual substrates disposed on the lower substrate and located in the active area;
a first inorganic layer positioned on each of the plurality of individual substrates, the first inorganic layer having a sidewall surface extending upward from the plurality of individual substrates;
an organic layer overlying the first inorganic layer, including overlying the sidewall surface of the first inorganic layer, the organic layer having a sidewall surface extending upward from each of the plurality of individual substrates;
a plurality of respective pixels disposed on the respective plurality of individual substrates, each pixel having electrical components comprising the pixel; and
an electrically conductive connection line disposed overlying the lower substrate and extending between components of the respective pixels on two adjacent individual substrates, the connection line being on the organic layer,
wherein the organic layer surrounds laterally and above the first inorganic layer together with each of the plurality of individual substrates and is present solely overlying the individual substrates and not between the individual substrates at locations where only the lower substrate is present.

2. The display panel of claim 1, wherein the sidewall surface of the first inorganic layer extends upward from the plurality of individual substrates at a first angle relative to the upper surface of the plurality of individual substrates; and
the sidewall surface of the organic layer extends upward from the plurality of individual substrates at a second angle relative the upper surface of the plurality of individual substrates.

3. The display panel of claim 2, wherein the first angle is within the range of 85° to 90° and the second angle is within the range of 65° to 85°.

4. The display panel of claim 1 wherein each individual substrate has a second modulus of elasticity that is higher than the first modulus of elasticity.

5. The display panel of claim 1, wherein the modulus of elasticity of the organic layer is lower than the modulus of elasticity of the first inorganic layer.

6. The display panel of claim 1, wherein the organic layer has a third modulus of elasticity that is higher than the first modulus of elasticity of the lower substrate.

7. The display panel of claim 1 further including a second inorganic layer overlying the first inorganic layer, the second inorganic layer having a sidewall surface, the organic layer overlying the second inorganic layer, including the sidewall of the second inorganic layer.

8. The display panel of claim 1 wherein a portion of the organic layer extends underneath a region of the first inorganic layer.

9. The display panel of claim 1 wherein the organic layer is formed of an acryl-based organic material.

10. The display panel of claim 1 further including third inorganic layer directly overlying the second inorganic layer.

11. A stretchable display device, comprising:
a lower substrate;
a plurality of first substrates disposed on the lower substrate and in which sub-pixels are defined;
a plurality of second substrates that are connected to respective first substrates that are adjacent to a respective second substrate;
a plurality of inorganic insulating layers disposed on each of the plurality of first substrates respectively, each of the plurality of inorganic layers having a sidewall exposed at an outer region of the first substrates;
an organic insulating layer disposed on each of the plurality of first substrates, respectively, the organic insulating layer covering upper surfaces and side surfaces of the plurality of inorganic insulating layers but not extending between the plurality of first substrates; and
a plurality of connection lines disposed on the organic insulating layer and the plurality of second substrates,
wherein the organic insulating layer surrounds laterally and is above the plurality of inorganic insulating layers on each of the first substrates.

12. The stretchable display device according to claim 11, wherein the plurality of inorganic insulating layers includes:
a first inorganic insulating layer placed on the plurality of first substrates;
a second inorganic insulating layer placed on the first inorganic insulating layer and having a smaller width than the first inorganic insulating layer; and
a third inorganic insulating layer placed to cover an upper surface and a side surface of the second inorganic insulating layer and a part of an upper surface of the first inorganic insulating layer.

13. The stretchable display device according to claim 12 further comprising:
a metal pattern located between the plurality of first substrates and the thin film transistor,
wherein the metal pattern is positioned between the first inorganic insulating layer and the second inorganic insulating layer.

14. The stretchable display device according to claim 12 further comprising:
a metal pattern located between the plurality of first substrates and the thin film transistor,
wherein the second inorganic insulating layer includes a plurality of second inorganic insulating layers, and
the metal pattern is positioned between the plurality of second inorganic insulating layers.

15. The stretchable display device according to claim 11, wherein the plurality of inorganic insulating layers includes:
a first inorganic insulating layer placed on the plurality of first substrates and including a first part having a first width and a second part placed on the first part and having a second width smaller than the first width;
a second inorganic insulating layer on the second part; and
a third inorganic insulating layer placed to cover an upper surface and a side surface of the second inorganic insulating layer and a part of an upper surface of the first inorganic insulating layer.

16. The stretchable display device according to claim 15, wherein the width of the second inorganic insulating layer is equal to or smaller than the second width.

17. A display panel, comprising:
a lower substrate having an active area and a non-active area adjacent to the active area, the lower substrate having a first modulus of elasticity;
a plurality of individual substrates disposed on the lower substrate and located in the active area, each individual substrate having a top surface;
a first inorganic layer positioned respectively on each of the plurality of individual substrates, the first inorganic layer having a bottom surface in contact with the top surface of the respective individual substrate, a sidewall surface extending upward from the bottom surface at a first angle that is between 85° to 90° and having a top surface;

a second inorganic layer positioned respectively on each of the plurality of individual substrates, the second inorganic layer having a bottom surface in contact with the top surface of the first inorganic layer, a sidewall surface extending upward from the bottom surface at a first angle and a top surface;

an organic layer overlying the first inorganic layer and second inorganic layer, the organic layer overlying and being in direct contact with the top surface of respective individual substrate and also in direct contact with the sidewall surface of the first inorganic layer and the second organic layer, the organic layer having a sidewall surface extending upward from the individual substrate at a second angle that is between 65° to 80°;

a plurality of respective pixels disposed on the respective plurality of individual substrates, each pixel having electrical components configured to be selected for emitting light; and an electrically conductive connection line disposed overlying the lower substrate and extending between respective pixels on two adjacent individual substrates, the connection line being directly on the organic layer.

\* \* \* \* \*